(12) United States Patent
Donohoe et al.

(10) Patent No.: US 6,784,108 B1
(45) Date of Patent: Aug. 31, 2004

(54) GAS PULSING FOR ETCH PROFILE CONTROL

(75) Inventors: Kevin G. Donohoe, Boise, ID (US); David S. Becker, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/651,871

(22) Filed: Aug. 31, 2000

(51) Int. Cl.⁷ .......................................... H01L 21/302
(52) U.S. Cl. ..................... 438/706; 438/710; 438/712; 438/714; 216/67
(58) Field of Search ............................. 438/766, 710, 438/712, 714, 726, 728; 156/345; 216/58, 67, 62

(56) References Cited

U.S. PATENT DOCUMENTS

| | | | | |
|---|---|---|---|---|
| 4,585,516 A | * | 4/1986 | Corn et al. | 156/345 |
| 4,786,352 A | * | 11/1988 | Benzing | 156/345 |
| 4,935,661 A | * | 6/1990 | Hennecke et al. | 313/231.31 |
| 5,368,685 A | * | 11/1994 | Kumihashi et al. | 156/345 |
| 5,429,978 A | * | 7/1995 | Lu et al. | 438/238 |
| 5,933,759 A | * | 8/1999 | Nguyen et al. | 438/700 |
| 5,980,767 A | * | 11/1999 | Koshimizu et al. | 216/60 |
| 6,051,503 A | * | 4/2000 | Bhardwaj et al. | 438/705 |
| 6,164,295 A | * | 12/2000 | Ui et al. | 134/1.1 |
| 6,183,938 B1 | * | 2/2001 | Lyons et al. | 430/313 |
| 6,287,980 B1 | * | 9/2001 | Hanazaki et al. | 438/726 |

* cited by examiner

*Primary Examiner*—Lan Vinh
(74) *Attorney, Agent, or Firm*—Workman Nydegger

(57) ABSTRACT

Etch profile control with pulsed gas flow and its applications to etching such as anisotropic etching of high aspect ratio features and etching of self-aligned contact structures in various processes. Pulsing can be applied according to this invention to the flow rate of a gas such as an etchant gas, a gas that leads to the deposition of a protective layer, a gas that modifies the deposition of a protective layer, and a gas that modifies etching.

40 Claims, 14 Drawing Sheets

GAS PULSING FOR ETCH PROFILE CONTROL

BACKGROUND OF THE INVENTION

1. The Field of the Invention

The present invention relates to semiconductor manufacturing in general, and more particularly to pulsing of gas flow as applied to selectively etching semiconductor structures having high aspect ratios, using a pulsed gas plasma, and the manufacture of semiconductor devices made thereby.

2. Background of the Invention

In the microelectronics industry, a "substrate" refers to one or more semiconductor layers or structures which includes active or operable portions of semiconductor devices. In the context of this document, the term "semiconductor substrate" is defined to mean any construction comprising semiconductive material, including but not limited to bulk semiconductive material, such as a semiconductive substrate, either alone or in assemblies comprising other materials thereon, and semiconductive material layers, either alone or in assemblies comprising other materials. The term "substrate" refers to any supporting structure including, but not limited to, the semiconductive substrates described above.

Miniaturization is the process of crowding an ever-increasing number of microelectronic devices into the same amount of semiconductive substrate real estate while maintaining and/or improving the quality of each microelectronic device. The pressure to fabricate ever-smaller microelectronic devices on the active surface of semiconductive substrates consequently requires the formation of smaller topographical features that define the components of the microelectronic devices. One such feature is the contact corridor, also known as the contact hole or channel (hereinafter "contact") which typically comprises a cylindrical depression that extends through a dielectric layer to an underlying structure that is electrically conductive or electrically semiconductive.

As the miniaturization process continues into the submicron range, process control and capability must also be improved. Miniaturization processes should nowadays be reliable at length scales that are smaller than 0.25 µm. As an example, a contact in the sub-half micron range preferably retains a specified critical dimension (CD) during a high-aspect ratio anisotropic etch through the dielectric layer in which it is formed. The contact opening will preferably maintain its initial cylindrical cross-section during the etch process. The etch process should not extend beyond the CD into underlying structures, nor create a contact too small (e.g., by tapering) nor too big (e.g., by bowing).

A "polymer gas" is an etchant that results in polymer deposition on a substrate or feature being etched. The difficulty of controlling high selectivity etch processes that use these so-called "polymer gases" increases as the required amount of selectivity and/or aspect ratio of the contact increases. For example, high aspect ratio contact etching requires control of the profiles at the top and at the bottom of the feature, while at the same time maintaining mask and substrate selectivity. Similarly, self-aligned contact (SAC) etches require that the etch continue while the local dimension of the etch front is suddenly shrunken in the narrow space defined by one or two sidewall films that are not to be etched.

Process performance problems include etches that tend to fail for 1) "etch stop", so called because the etch process stops abruptly; 2) excessive etch profile taper; or 3) profile widening, or "bow".

Under conventional operating conditions, the process windows for these etch steps are small compared to the ability of the hardware to control the process variables. One such variable is flow rate. Typically, too low a process gas flow rate results in low selectivity, and too high a process gas flow rate results in a tapered profile or etch stop. These results are usually interpreted in terms of the buildup of polymer on the etch front and on the feature sidewalls.

Another problem in conventional practice is that the difference between the mixture of feed gases needed to obtain a good result is very close to the composition of feed gases that causes the etch to fail. In other words, the amount of polymer deposition is too sensitive to gas flow variations to control the etch process over the range of tools, conditions, and incoming material variations encountered under wafer fabrication conditions. It would be an advance in the art to overcome this and the foregoing problems.

SUMMARY OF THE INVENTION

The present invention provides a method to reduce or substantially eliminate the above-stated process failure mechanisms. The polymer deposition process disclosed herein is controlled in a unique manner with respect to the process of the present invention. It provides for the use of a pulsed flow of a gas, such as a polymer gas, to achieve an etch that would otherwise fail for selectivity when used in any one of a variety of etch process. For instance, the etch process can be used in a self-aligned contact etch (SAC) or other etch process that is used to form a high aspect ratio feature.

It is worth noting that the mechanism for pulsing etch gases is distinct from that of pulsing the power of the reactor. The term "gas pulsing" as used herein means alternating different gas flow conditions. Gas pulsing refers more particularly to the sequential, repetitive use of a plurality of different time varying gas flow rates in a process or in a process step. The pulsing of the particular gas takes place for a time such that the time-varying high flow and low flow conditions are exhibited in the etch chamber. In some embodiments of the present invention, gas pulsing takes place for more than two cycles. Pulsing refers to time-varying gas flow rates, with no limitation as to the amplitudes, phases and other characteristics of time-varying phenomena as applied to pulsed gas flows. Furthermore, pulsing includes varying gas flow rates between at least two flow rate values, one of which might be as small as zero. Accordingly, "pulsed flow" refers to a time-varying flow between a maximum flow rate and a minimum flow rate regulated in a way such that the flow rate preferably experiences at least two periods. The number of different process gases that are subjected to pulsed flow conditions in embodiments of the present invention is not a limiting factor. Accordingly, one or more than one gas can be subjected to pulsed flow conditions, and when more than one gas flow is pulsed, the pulsing characteristics of each gas can be different from the pulsing characteristics of any other gas. Examples of gases whose flow rate can be subjected to pulsing according to the present invention include gases such as etchant gases, gases that lead to the deposition of a protective layer, gases that modify the deposition of a protective layer, and gases that modify etching. In contrast to gas pulsing, "pulsing the power of a reactor" typically describes the repetitive cycling of a power value in an etch step between two amplitudes.

The present invention relates to time-varying gas flow rates as applied to the manufacturing of semiconductor devices in processes such as anisotropically etching processes. In one embodiment of the inventive process, an anisotropic etch is conducted through a layer of dielectric material, such as silicon dioxide. The anisotropic etch process etches through silicon dioxide and then stops on an underlying layer. In one embodiment, the present invention provides a process that is suitable for use in a high density etch tool, such as, for example, the Applied Materials IPS Centura® system, for etching silicon dioxide by a pulsed delivery of a gas mixture to control the flow rate of an etch gas mixture. When a high density etch tool is used to etch through silicon dioxide using a pulsed delivery to control the flow rate of an etch gas mixture, the etch gas mixture etches the silicon dioxide dielectric layer substantially anisotropically and stops etching on an underlying layer that is compositionally dissimilar to the silicon dioxide dielectric layer. Examples of the underlying layer include, but are not limited to, silicon, silicides such as refractory metal silicides, metal films, silicon nitride, silicon oxynitride, and doped silicon dioxide such as borophosphosilicate glass (BPSG), phosphosilicate glass (PSG), and borosilicate glass (BSG).

Gas pulses that increase the flow rate of a gas preferably increase the polymer deposition rate on the substrate or feature as used in embodiments of this invention to control deposition on the etch fronts and on feature and mask sidewalls. Similarly, pulses according to this invention that decrease the flow rate of such a gas preferably have an opposite and still controllable effect. Also, the use of pulses of increased flow of a gas that can decrease polymer deposition rates on the substrate or feature under the conditions of the etch process can be used according to the present invention to control the selectivities and profiles without having the etch process lose profile control or encounter etch stop. A self-aligned contact (SAC) is used hereinbelow as an example and not as a limitation. The pulsing according to the present invention is preferably applied in a highly controlled way. This type of control can be achieved by any one among a variety of mechanisms, such as mechanisms that use piezoelectric valves, or other mechanisms to vary at high speed, precisely and controllably, at least one gas flow rate between at least two different flow rate values.

These and other features of the invention will become apparent to those skilled in the art after referring to the following description and examples.

BRIEF DESCRIPTION OF THE DRAWINGS

In order that the manner in which the above-recited and other advantages of the invention are obtained may be more fully explained, a more particular description of the invention briefly described above will be rendered by reference to specific embodiments and applications thereof which are illustrated in the appended drawings. Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Additional advantages of the present invention will become readily apparent to those skilled in this art from the following detailed description, wherein preferred embodiments of the invention are shown and described in the disclosure, simply by way of illustration of the best mode contemplated for carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

A novel etching process for the fabrication of semiconductor devices is described herein. In the following description, numerous specific details are set forth, such as specific materials and process parameters, etc., in order to provide a thorough understanding of the present invention. It will be obvious, however, to one skilled in the art that the present invention may be practiced without these specific details. In other instances, well known aspects of etching processes and machinery have not been described in particular detail in order to avoid unnecessarily obscuring the present invention. It is to be understood that the drawings, wherein like structures are provided with like reference designations, are diagrammatic and schematic representations of embodiments of the present invention and are not drawn to scale.

Some of the drawings, as will be apparent from the context below, depict partial diagrammatic representations of a semiconductor device such as a semiconductor substrate and a self-aligned contact thereto as a part of an integrated circuit structure. Thus, the drawings only show the structures necessary to understand illustrations of the present invention. Additional structures known in the art have not been included to maintain the clarity of the drawings.

Figure 1:
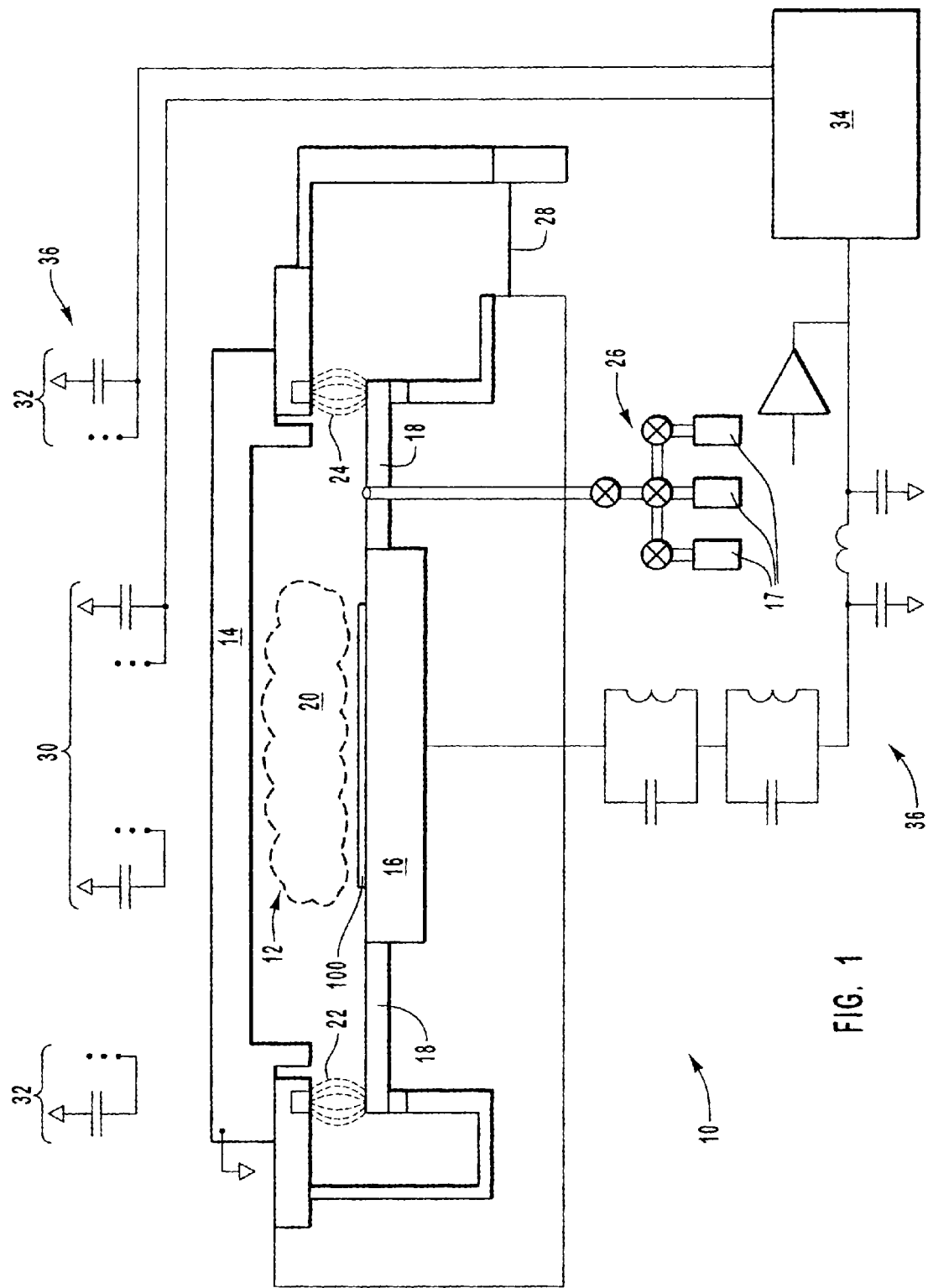
FIG. 1 is a schematic cross-sectional and wiring schematic of an etcher, such as a high density etcher, suitable for use with the process of the present invention and together therewith comprising an embodiment of an inventive etch system with an example of a pulsed flow control including a manifold with piezoelectric values.

Referring to FIG. 1, an inductively-coupled plasma etcher is schematically represented. U.S. Pat. No. 5,423,945, assigned to Applied Materials, Inc., which discloses the structure and operation of some features of an apparatus which is generally depicted in FIG. 1, is incorporated herein by reference.

The system 10 includes an etch chamber 12 primarily defined between a grounded silicon roof 14, an RF powered (bias) semiconductive substrate support 16, and a silicon ring 18 surrounding the semiconductive substrate support 16, on which a semiconductive substrate 100 is disposed for processing. A plasma, generated over semiconductive substrate 100 is confined by magnetic fields, as seen at reference numerals 22 and 24. Gases are supplied to chamber 12 through a valved manifold 26, which is connected to a plurality of gas sources (not shown). Mechanisms 17 are used for controlling the pulsing conditions according to the present invention. These mechanisms are piezoelectric valves in some embodiments of the present invention In other embodiments, these mechanisms are replaced by any other devices that can also be effectively used to vary at high speed, precisely and controllably, at least one gas flow rate between at least two different rate values. Evacuation of etch chamber 12 may be effected as desired through a valve 28, as is known in the art.

An RF power source is supplied to an inner antenna 30 and outer antenna 32 by an RF generator 34. The inner and outer antennae 30 and 32 are tuned for resonance in order to provide an efficient inductive coupling with plasma 20. Inner antenna 30, outer antenna 32, RF generator 34, and associated circuitry comprise a source network 36. Bias power is also supplied to semiconductive substrate support 16 by RF generator 34. RF generator 34, supplying power to semiconductive substrate support 16, comprises a bias network 38 with associated circuitry as shown. RF bias power is delivered at 1.7±0.2 MHz, RF outer antenna power at 2.0±0.1 MHz, and RF inner antenna power at 2.3±0.1 MHz.

Other details of the system 10 being entirely conventional, no further discussion thereof is required. Semiconductive substrate 100 is attached to a monopolar electrostatic chuck 16.

Currently, Applied Materials, Inc., of Santa Clara, Calif., offers the Dielectric Etch IPS Centura® system (the "IPS system") for etching high aspect ratio contacts, among other uses. The IPS system uses an inductively-coupled, parallel plate technology that employs temperature controlled Si surfaces within the etch chamber in combination with fluorine-substituted hydrocarbon etch gases to achieve an oxide etch having a selectivity of BoroPhosphoSilicateGlass (BPSG) oxide to silicon nitride in excess often to one.

The IPS system can be used in a plasma process that employs a gas flow of a relatively high rate and somewhat complex chemistry, relatively high process temperatures, and CO (carbon monoxide) in the gas mixture. Specifically, the process employs 300–400 (and preferably 358) standard cubic centimeters per minute (sccm) Ar (argon), 55 sccm CO, 32 sccm $CHF_3$ (trifluoromethane), and 26 sccm $CH_2F_2$ (difluoromethane) with a process pressure of 50 mTorr. Source power input is about 1650 watts, apportioned as 1400 watts to the outer antenna and 250 watts to the inner antenna. Bias power is about 800 watts. It is desirable that a high volume of Ar be used to maintain a plasma state within the etch chamber of the IPS system.

The IPS system employs an adjustable, dual-antennae inductive source and bias power control to adjust etch results. Under conditions considered appropriate for commercially useful etch processes, this tool, and others, can deposit >500 Å/min of polymer on the semiconductive substrate 100 if the bias power is set to zero. In other words, any surface that is not powered is exposed to a flux of pre-polymer material that will deposit on the surface, unless conditions are altered to prevent its deposition.

As will become apparent from the following discussion, the foregoing description of an IPS system depositing a polymer layer is not provided as a limitation to the present invention, but merely as an example of a system and process with which embodiments of the present invention can be implemented. Other systems and processes can also be used to effectively implement embodiments of the present invention, as it will be appreciated by those of ordinary skill in the art.

FIGS. 2–5 and FIGS. 6–9 schematically show partial cross-sectional views that illustrate a technique for performing selective sidewall deposition for a self-aligned contact etch and a high aspect ratio contact etch, respectively, for a semiconductor device according to the present invention. While these drawings depict the formation of a single contact to a substrate, it should be understood that a multiplicity of recesses, other than those comprising a contact opening, would be typically formed during fabrication of a semiconductor device. As such, it should be understood that the illustrations shown in FIGS. 2–9 are not meant to be actual cross-sectional views of any particular semiconductor device, but are merely idealized representations which are employed to more clearly and duly depict and describe embodiments of the process of the present invention than would otherwise be possible.

One aspect of the present invention relates to extending the process window for the above-mentioned selective etch processes. Under standard operating conditions, the process windows for these etch steps are small in light of the ability of the hardware to control the process variables. One such variable is gas flow rate. In conventional practice, a low flow rate generally results in low selectivity, and a higher flow rate generally results in a tapered profile or "etch stop."

One embodiment of the present invention includes a method of increasing etch selectivity of a self-aligned contact (SAC) etch while permitting a desirable degree of polymer build-up. The polymer build-up that would lead to an etch stop or an excessively tapered profile at the bottom of the contact is not observed to develop in embodiments of the present invention. In one embodiment, the implementation of this method includes providing a semiconductor substrate 100 in an etch tool such as the Applied Materials IPS system. Other embodiments of the present invention are implemented on patterned substrates.

As understood in the art, etching involves a competition between removal and deposition of material. Typical etching techniques remove polymer material from horizontal surfaces at a higher rate than the polymer material is deposited on such surfaces. In contrast, a net polymer material deposition is achieved on vertical surfaces.

Even though specific types of etching are referred to herein, it is understood that the present invention is not limited by such examples of etching, which are provided merely for illustrative purposes, but not by way of limitations. For example, embodiments of the present invention are implemented in high density etcher applications. Other embodiments of the present invention are implemented in reactive ion etching (RIE) applications. Still other embodiments of the present invention are implemented in variations of high density etching, and in RIE variations, such as MRIE.

Although the present invention is not restricted to a single interpretive analysis of its etch profile control, the results achieved by implementing embodiments of the present invention are consistent with the establishment of a compromise between conditions that lead to competing effects. Under one type of such conditions, protective layer formation is enhanced. Under another type of such conditions, protective layer formation is not enhanced. Pulsing according to the present invention leads to the deposition of enough protective layer, with sufficient selectivity, as to avoid the problems and failures exhibited by conventional techniques.

The following discussion first focuses predominantly on examples of features etched according to embodiments of the present invention and their comparison with failure modes exhibited by conventional etching techniques. After these examples of physical embodiments of etch profiles are provided, the following discussion focuses predominantly on examples of pulsed flow conditions according to the present invention.

Embodiments of Etch Profiles

Figure 2:
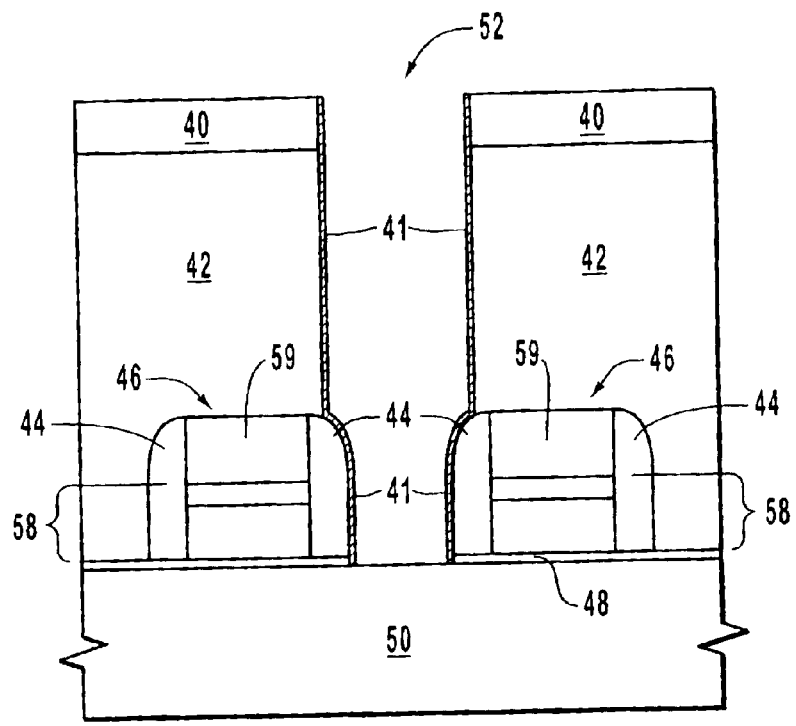
FIG. 2 is a schematic cross-section of a layered semiconductor substrate, after a self-aligned contact etch has been performed, according to an embodiment of the process of the present invention.
Figure 3:
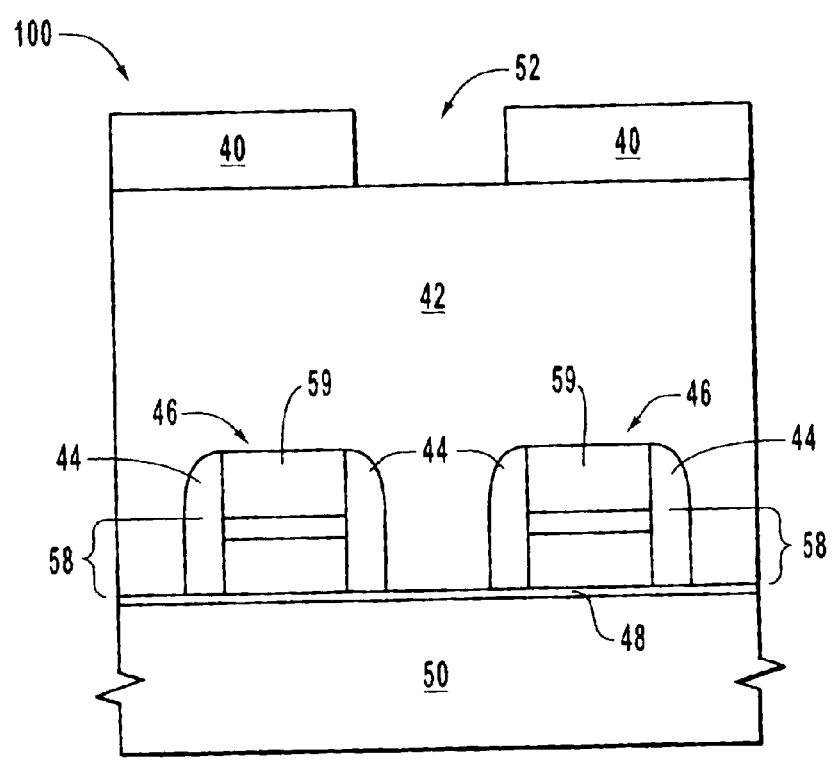
FIG. 3 is a schematic cross-section of the layered semiconductor substrate of FIG. 2, prior to undergoing the self-aligned contact etch.

Referring to FIGS. 2 and 3, etching is carried out through use of a patterning mask 40 upon bulk dielectric layer 42 that is disposed upon etch stop layer 44. Bulk dielectric layer 42 comprises, for example, BPSG. Etch stop layer 44 comprises a nitride, for example, or any suitable dielectric and may cover other structures, such as gate stack 46. Gate stack 46, which includes a composite 58 of layers, as well as an upper dielectric layer 59, is disposed upon gate oxide layer 48, which is ultimately disposed upon semiconductor material 50. In an embodiment provided by way of example but not as a limitation, dielectric layer 59 comprises at least one dielectric material such as an oxide, a nitride, and combinations thereof; the top layer in composite 58 of layers comprises a material such as a silicide; and the bottom layer in composite 58 of layers comprises a material such as polysilicon.

The semiconductor device is located in a desired etcher with an etching area and is etched with a chemical etchant system, typically a fluorinated chemical etchant system, to form a predetermined pattern therein. The etchant system may comprise an etchant composition such as, for example, a fluorocarbon such as $CF_4$, Ar, at least one hydrofluorocarbon such as $CH_2F_2$ and $CHF_3$, higher molecular weight compounds including is fluorocarbons such as $C_4F_8$ and $C_5F_8$, mixtures of these substances, and other substances. The etchant system is substantially in a gas phase during the etching of the multi-layered structure.

Exposed dielectric layer 42, composed of $SiO_2$, is selectively etched anisotropically at a relatively higher etch rate than the etch rate of the surrounding layers. In one embodiment of the present invention, the etch rate and sidewall polymer deposition are moderated by the pulsing of fluorocarbon gas into the etch recipe.

In the example shown in FIG. 2, etching is carried out by formation of a self-aligned contact hole through mask 40 and dielectric 42 that uses a first etch gas, namely the hydrofluorcarbon gas CHF or the like as a constant etch gas source. As applied to this particular example, etching according to one embodiment of the present invention is carried out further with the pulsing of an etch selectivity fluorocarbon gas that is intermittently blended with the hydrofluorocarbon gas during the etch process. Pulsing of the fluorocarbon gas is carried out in a range from about 0 sccm to about 25 sccm, preferably from about 15 sccm to about 23 sccm, and most preferably, from about 18 sccm to about 22 sccm. The time period of an overall gas pulsing cycle is in a range from about 10 to about 60 seconds, preferably from about 15 to about 30 seconds.

The fluorocarbon gas pulse has a period in a range from about 1 second to about 30 seconds, preferably from about 10 seconds to about 20 seconds, and most preferably about 15 seconds.

Figure 4:
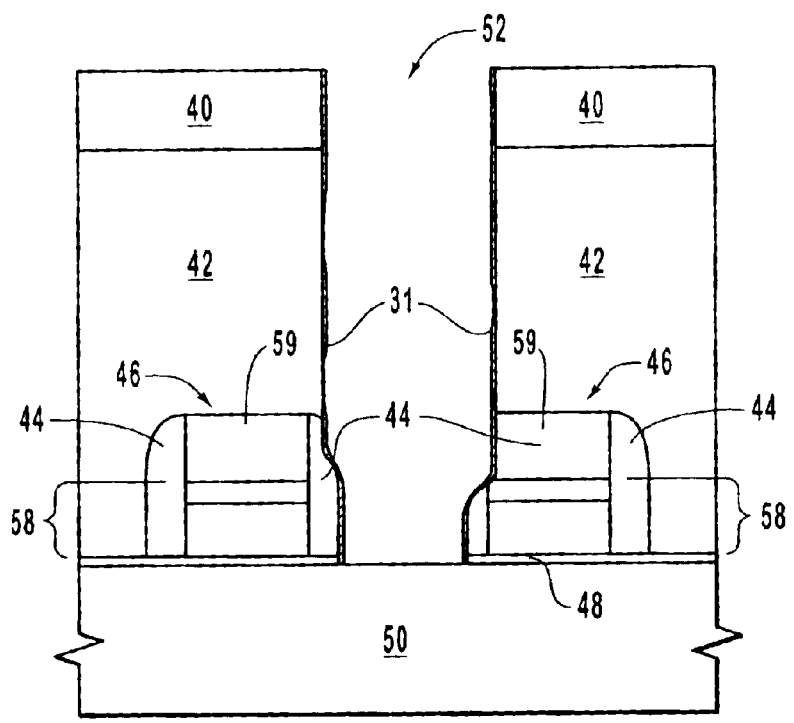
FIG. 4 is a schematic cross-section of the layered semiconductor substrate of FIG. 2, illustrating a failed self-aligned contact etch resulting from loss of selectivity that is experienced in conventional practice.
Figure 5:
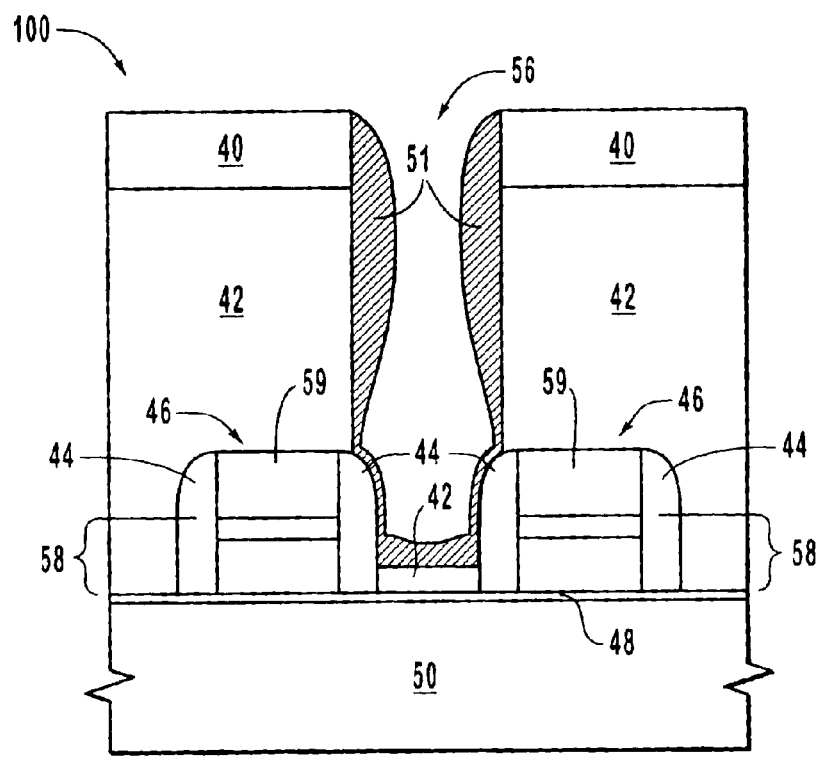
FIG. 5 is a schematic cross-section of the layered semiconductor substrate of FIG. 2, illustrating a failed self-aligned contact etch resulting from "etch stop" that is experienced in conventional practice.

FIGS. 4–5 and 8–9, which depict typical process failures in conventional etching operations, will now be discussed. FIG. 4 illustrates a typical failure post-etch condition for a SAC structure due to loss of selectivity. The process etch is not sufficiently selective to the nitride layer 44 which encapsulates the gate stack 46. Thus, the process etch results in the removal of nitride layer 44 so as to expose gate stack 46. The exposed gate stack 46 will subsequently result in an electrical short with the conductive contact plug that is subsequently deposited into the SAC-etched feature.

As shown in FIG. 2, a thin polymer film 41 is deposited according to one embodiment of the present invention on the side walls of features 40, 42, and 44. According to conventional techniques, however, deposition of a layer of polymer on the same side walls is typically achieved by flowing polymer-forming gas at a rate such that irregular thicker polymer deposits develop on at least one of the side walls. This undesirable growth is shown as overgrowth 51 in FIG. 5. In some instances of conventional practice, overgrowth 51 extend towards each other to the point of coalescing together and thus stopping the etching. The typical failure post-etch condition for a SAC structure shown in FIG. 5 includes the formation of a thick sidewall polymer at the etch front before the contact reaches the silicon. The polymer at the top of the sidewall structure may be thicker than it is at the bottom. If this material gets too thick, it bridges over the etch front and the etch stops. It also may get thick enough to allow some oxide to remain unetched along the sidewall of the nitride. This diminishes the size of the bottom of the contact opening where it intersects with the underlying silicon.

FIG. 4 illustrates the situation which can be prevented with the pulsed addition of a deposition gas according to an embodiment of the present invention. The etch profile reflects an etch condition that has insufficient selectivity to the nitride film 44 that encapsulates the gate stack 46, for example. The polymer 31 deposited on the vertical BPSG sidewall 42 is thin, and substantially no polymer has been deposited on the horizontal and rounded profile of the nitride encapsulation 44, the gate stack 46 thereby not providing sufficient etch selectivity.

As a deposition gas, which is a selective gas, is pulsed into the chamber according to an embodiment of the present invention, a thicker polymer is deposited along the vertical BPSG sidewall 42. This polymer may also be deposited on nitride layer 44 which encapsulates the gate stack 46. The deposition of the polymer along nitride layer 44 can occur once nitride layer 44 is exposed. When so exposed, nitride layer 44 has a rounded shape. From the foregoing, it is seen that the selectivity of the etch process is improved without generating a failure due to excess deposition as was seen in FIG. 5.

Figure 6:
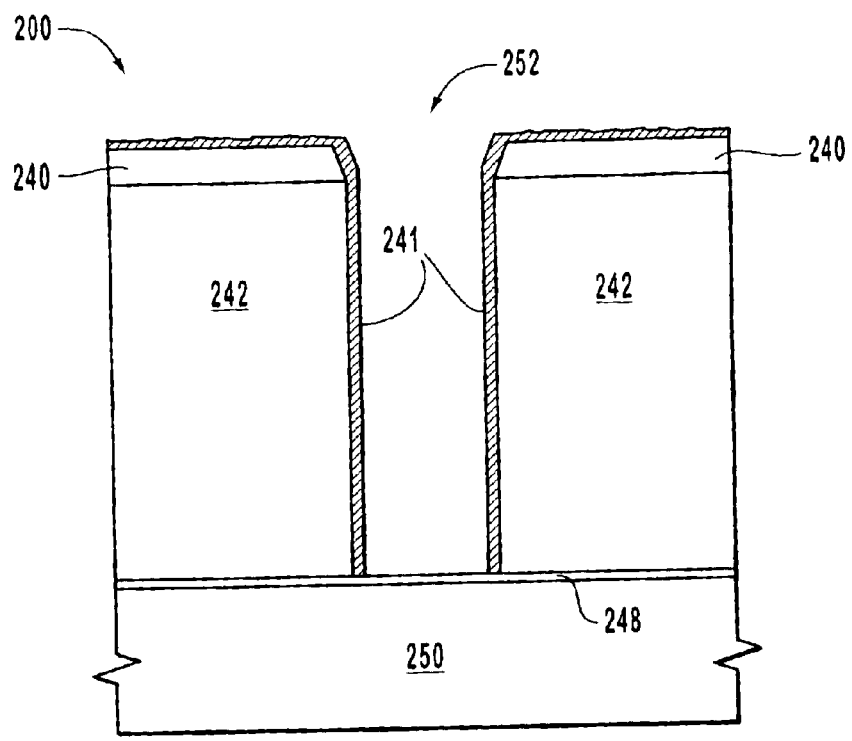
FIG. 6 is a schematic cross-section of the layered semiconductor substrate, after a high aspect ratio etch has been performed, according to an embodiment of the process of the present invention.

As illustrated by the examples shown in FIGS. 2 and 6, a preferred minimum thickness of polymer is deposited on the side walls of features 40, 42, 44, 240, and 242 to protect and maintain the profiles of the side walls without undesirable irregular deposits. This deposited polymer is shown as polymer film 41 in FIG. 2 and as polymer film 241 in FIG. 6.

As indicated more generally above regarding the formation of a protective layer, the process window improvement achieved with the present invention is consistent with the characteristics of protective layer formation and how it protects side wall materials. As shown in FIG. 2, the thickness of the protective layer polymer in this example, needed to protect the side wall materials is typically thin. Conventional deposition techniques fail to slow down the deposition rate and/or fail to prevent the undesirable etching of structures that should be protected, as shown in FIGS. 4, 5, 8 and 9. Pulsing, according to the present invention, provides a time varying flow that alternates enhancement of protective layer formation conditions with conditions under which such protective layer formation is not enhanced, thus avoiding the failures exhibited by conventional techniques, such as those shown in FIGS. 4, 5, 8, and 9.

Figure 8:
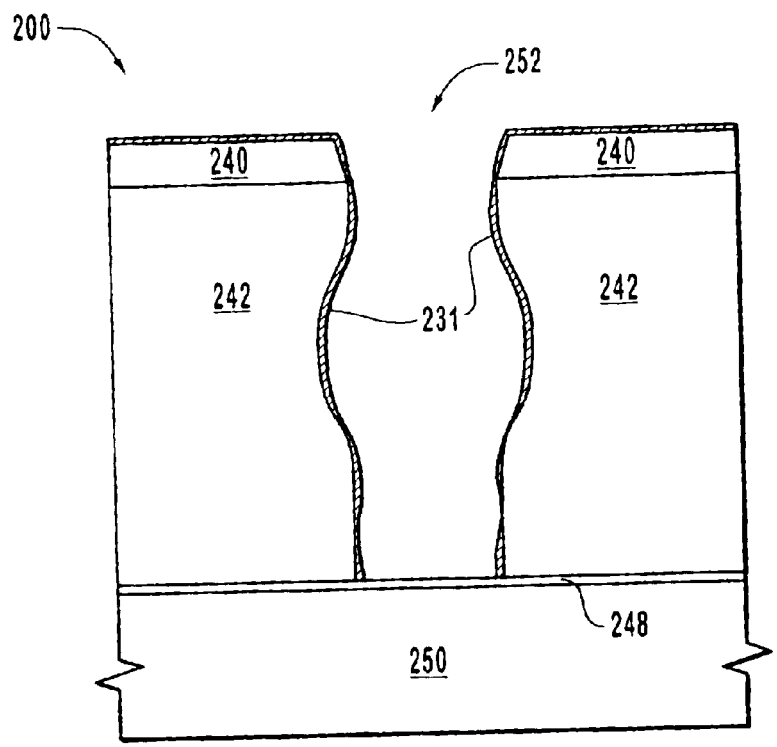
FIG. 8 is a schematic cross-section of the layered semiconductor substrate of FIG. 7, illustrating a failed high aspect ratio contact etch resulting from bowing.
Figure 9:
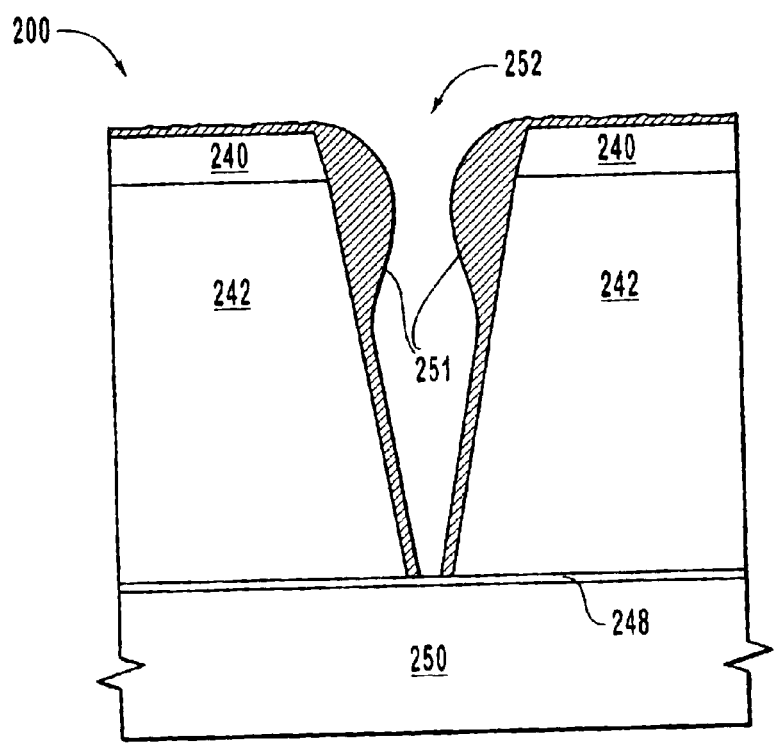
FIG. 9 is a schematic cross-section of the layered semiconductor substrate of FIG. 7, illustrating a failed high aspect ratio contact etch resulting from tapering.

FIGS. 8 and 9 illustrate the typical failure modes associated with performing a high aspect ratio contact etch. FIG. 8 depicts the characteristic bowing that results from insufficient etch selectivity. The etch front progresses in both the vertical and horizontal directions because there is not enough of a protective layer 231, such as a polymer, that is build up along the sidewalls. Without the protective layer passivating the surface the etch front moves into the bulk dielectric in the horizontal direction.

FIG. 9 illustrates the process failure which results from "taper". In this instance, there is excessive build up of a protective layer 251, such as a polymer, that is deposited along the sidewalls of the bulk dielectric. The build up of the protective layer decreases the lateral dimension of the contact as the etch front moves vertically downward. The passivation caused by this protective layer tends to slow the etch process, and eventually results in an "etch stop" before the desired contact with the underlying silicon. Alternatively, the "taper" can also cause a process failure that produces a contact opening that is too small. In this case, the small size of the contact opening can cause a failure in an integrated circuit in which the small contact opening is located.

Referring now to FIGS. 6–9, another embodiment of the present invention is provided for forming a high aspect ratio contact in a semiconductor substrate. The method includes providing an etcher 10, such as the Applied Materials IPS etch chamber, and pulsing gases into the chamber during the etch process.

Figure 7:
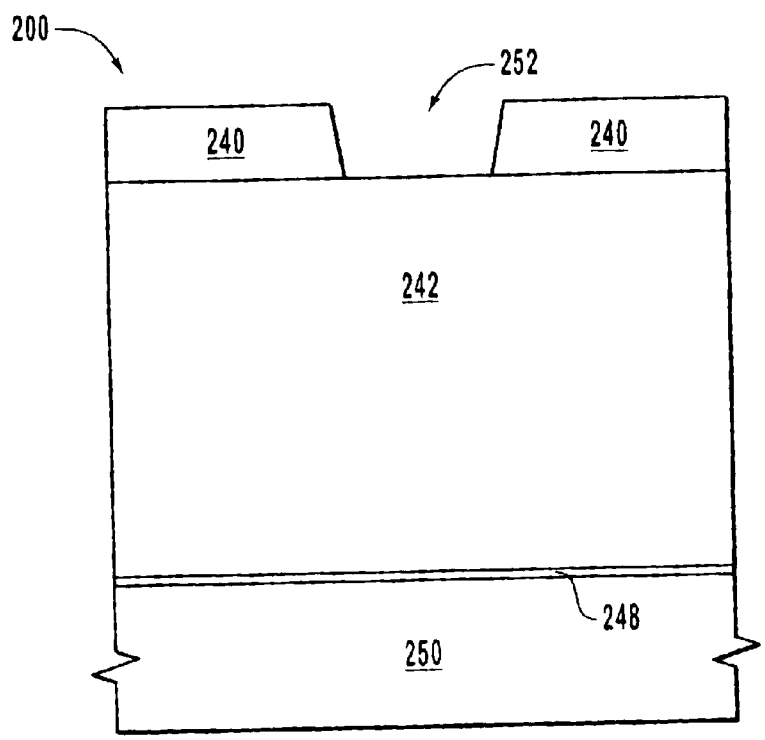
FIG. 7 is a schematic cross-section of the layered semiconductor substrate of 6, prior to undergoing the high aspect ratio etch.

As illustrated in FIG. 7, a semiconductor substrate 250 is provided having a bulk dielectric 242 disposed thereon. Alternatively, an etch stop layer 248 may also be provided. Additionally, the etch stop layer may include a semiconductive material or any other material that is compositionally different from the bulk dielectric 242. Preferably, the bulk dielectric 242 is comprised of BPSG, and the etch stop layer 248 is a thermal oxide, silicon nitride such as $Si_3N_4$, or monocrystalline silicon.

In one embodiment of the present invention that is provided by way of example but not as a limitation, the method further comprises the anisotropic etching of contact 252, as illustrated in FIG. 6, with a single gas process using $CHF_3$, wherein $CHF_3$ is flowed at a relatively low value of 18 sccm for 18 seconds and then flowed at a higher value of 28 sccm for 18 seconds. This cycle is preferably repeated to achieve the desired etch depth. In another embodiment, the $CHF_3$ flow rate is kept constant and some other gas that increases deposition on the substrate and features is pulsed between two flow rate values every 18 seconds.

The selectivity to etch stop 248 is increased as the proportion of fluorocarbon gas increases. In addition to BPSG, the bulk dielectric 242 can be comprised of PSG, SOG, and other suitable materials. Likewise, the etch stop layer 248 can be comprised of silicon oxynitride or TEOS and the like, as well as the silicon nitride described above.

Even though the foregoing discussion of etch profiles refers by way of example to the deposition of a polymer film, it is understood that this type of deposit is not a limitation of the present invention. Pulsing in the context of the present invention encompasses pulsed flow of at least one material that leads to the formation of at least one protective layer, including, but not limited to, at least one polymer film. Furthermore, pulsing conditions according to the present invention refer to at least one pulsed gas flow that leads to surface deposition, regardless of the substrate on which deposition takes place.

Pulsed Flow Conditions

An example is presented here for the purpose of introducing and illustrating terminology that is used in this specification. For simplicity, only one gas is considered under pulsing conditions in this example. When this gas is flowed at 18 sccm for 18 s and then flowed at 28 sccm for 14 s, the period for this pulsed process is 14 s+18 s=32 s . The flow of 28 sccm for 14 s provides the conditions that enhance protective layer formation, whereas the flow of 18 sccm for 18 s provides the conditions that do not enhance protective layer formation. Duty cycle is defined as the fraction of time during which conditions for enhancing layer formation are provided. The time during which conditions that enhance protective layer formation are provided is also referred to as "on" time. In this example, the duty cycle is 14/32=0.4375. In addition to a fractional quantity, the duty cycle is also expressed as a percentage. Therefore, the duty cycle in this example is expressed as 0.4375 or as a 43.75% duty cycle.

The term "state" in this context refers to steady state concentration conditions within the chamber into which the gas (gases) is (are) pumped. In this example, "state 1" refers to the steady state concentration conditions that prevail when the gas is flowed at 18 sccm, and "state 2" refers to the steady state concentration conditions that prevail when the gas is flowed at 28 sccm. Naturally, whether any of these states is actually realized within the chamber depends on the timing at which pulsing is applied. For example, when pulsing is applied very quickly, or equivalently when the gas flow oscillates between limiting flow rate values very quickly, steady state concentration conditions will not be reached, and thus states 0 and 1 will not actually be realized within the chamber.

Pulsing conditions are also described herein in terms of etch depth, or how deeply etching proceeds under each limiting condition, and in terms of evolution of etch depth with respect to the limiting etching depths. Etch depth evolution provides a description in terms of variation of the conditions at fixed increments of etch depth.

The term "dimensionless time" is a common engineering term that is defined as real time divided by the average residence time $\tau$ (tau) of the gas in the plasma. For example, as the gas flow rate is increased, the average residence time is decreased since the gas moves through the plasma more quickly.

The foregoing characteristics of pulsing conditions are used herein in diagrammatic descriptions of different pulsing regimes. Accordingly, evolution with respect to states 1 and 2 as a function of dimensionless time is shown in some of the accompanying figures, and evolution with respect to states 1 and 2 as a function of etch depth, also referred to as depth of process, is shown in some of the accompanying figures. In addition, pulsing conditions are shown in other figures as gas flow rate(s) depicted as function(s) of real time.

Figure 10:
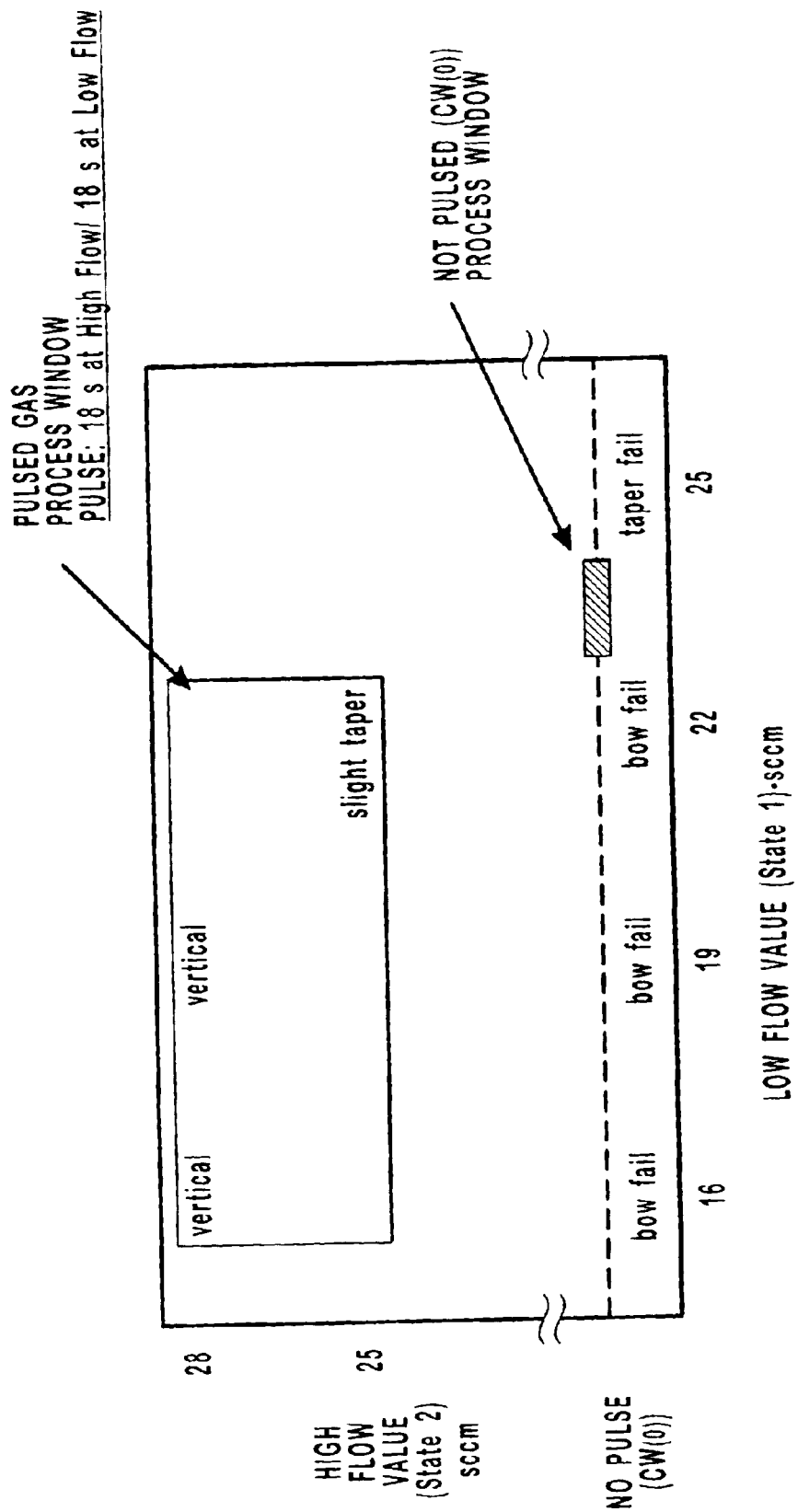
FIG. 10 is a graph illustrating the increased process window achievable with the process of the present invention.

FIG. 10 shows a graph of high versus low flow rates of a pulsed $CHF_3$ gas plasma etch process. This graph illustrates the effect of pulsed gas flow rates according to one embodiment of the present invention on the etch profile. In particular, this graph shows the increased process window that is achieved when pulse flow conditions according to the present invention are used. An increased process window leads to an increased tolerance to possible errors in delivered flow rate. Furthermore, the broadening of the process window according to the present invention is achieved while maintaining etch profile control at smaller dimensions. The increased tolerance and the ability to maintain etch profile control when etching small features in the sub-micron domain, and more specifically at length scales smaller than 0.25 μm, lead to increased yield and manufacturing cost reduction because failures are reduced and tolerance is increased.

In the experiments that provided the data shown in FIG. 10, the pulsed gas flow rates were changed from a low flow rate value to a high flow value every 18 seconds. The period of pulsing in these experiments was 36 s with 50% duty cycle. Pulsing at high flow rate for about 18 s and at low flow rate for about 18 s provided an etch rate of about 133 Å/s.

For purposes of comparison, the line marked "CW(0)" shows the etch profiles obtained with no pulsing. Under these conditions, the gas flow was kept at a "low flow" value for the entire etch process.

FIG. 10 shows that for the CW(0) flow condition, i.e., no pulsing condition, flow rates from 16 to nearly 23 sccm generate bowed profiles similar to the failure shown in FIG. 8, and that flows greater than about 24 sccm generate a taper fail profile that was similar to that shown in FIG. 9. Therefore, the process window for $CHF_3$ flow is between 23 and 24 sccm under these process conditions. This process window, which is approximately 1 sccm wide, is shown in FIG. 10 in the form of the shaded rectangle. In the context of conventional manufacturing environments for submicron features, this process window would be considered extremely small.

The pulsed flow data according to the present invention as depicted in FIG. 10 show a larger process window. For example, the pulsed conditions of 16 sccm low flow and 28 sccm high flow give substantially the same vertical profile obtained with 19 sccm low flow and 28 sccm high flow. Even flow rate values of 21 sccm low flow rate and 25 sccm high flow rate resulted in profiles that, although slightly tapered, were considered acceptable. The rectangle marked in FIG. 10 as "pulsed gas process window" illustrates the range of flow rates according to the present invention that were observed to provide acceptable profiles. In contrast, the shaded rectangle marked in FIG. 10 as "CW(0) Process Window" shows the approximately 1 sccm process window that is observed under CW(O), non-pulsed, flow.

Figure 11A:
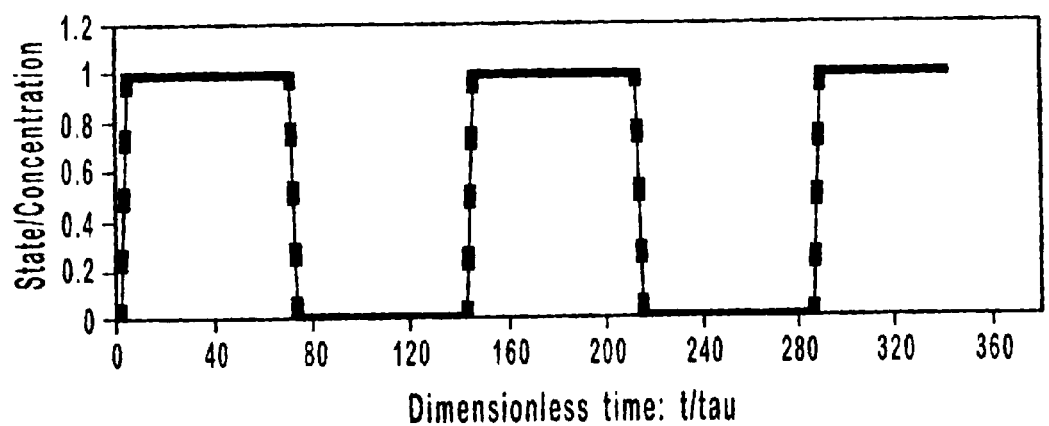
FIGS. 11A–11B show approximate concentration and state responses for pulsing conditions like those under which data shown in FIG. 10 were obtained.
Figure 11B:
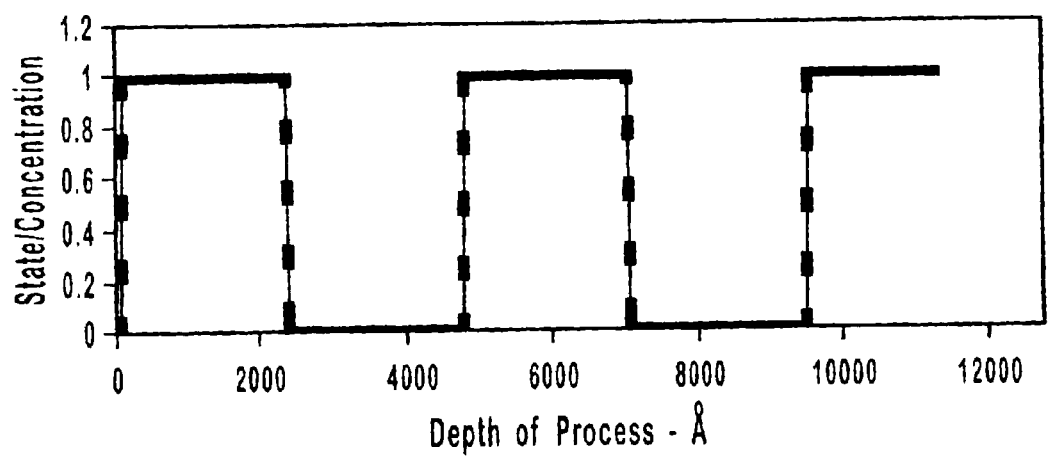

FIGS. 11A–11B schematically show concentration (and state) responses under pulsing conditions approximately equal to those maintained in the experiments that provided the data shown in FIG. 10. FIG. 11A schematically shows concentration (or state) response as a function of dimensionless time and FIG. 11B schematically shows concentration (and state) response as a function of depth of process. As indicated with respect to FIG. 10, the period was about 36 s, high flow rate was maintained for about 18 s and low flow rate was maintained for about 18 s. On time was about 18 s, and about 50% duty cycle. In these experiments, etch rate was about 133 Å/s, was about 0.25 s, state 1 etch depth was about 2394 Å, state 2 etch depth was about 2394 Å, and total etch depth was about 4788 Å per cycle. State 1 in FIGS. 11A–11B corresponds to one ordinate reading of 0 and state 2 corresponds in the same figures to an ordinate reading of 1. The graphs shown in FIGS. 11A and 11B depict an approximate concentration evolution because the etch rate in state 1 has been assumed to be the same as that in state 2, even though these rates typically differ from each other by some amount. In terms of $\tau$, the period was about $144\tau$ and the on time was about $72\tau$. Consequently, the period and $\tau$ for these experiments satisfy the relationship period $>>\tau$. The dashed thick lines in FIGS. 11A and 11B show the state evolution and the solid thin lines show the actual concentration evolution.

FIGS. 11A and 11B show that when period $>>\tau$, the concentration tracks the input flow rate and the etch process alternates between two steady state conditions. This is depicted in FIGS. 11A and 11B by the superposition of the dashed thick line with the solid thin line. Under the pulsing conditions referred to with respect to FIGS. 10, 11A and 11B, the conditions that prevail in the chamber for most of the time are steady state conditions, and the medium in the chamber can be characterized for most of the time as being in state 1 or in state 2.

Figure 12A:
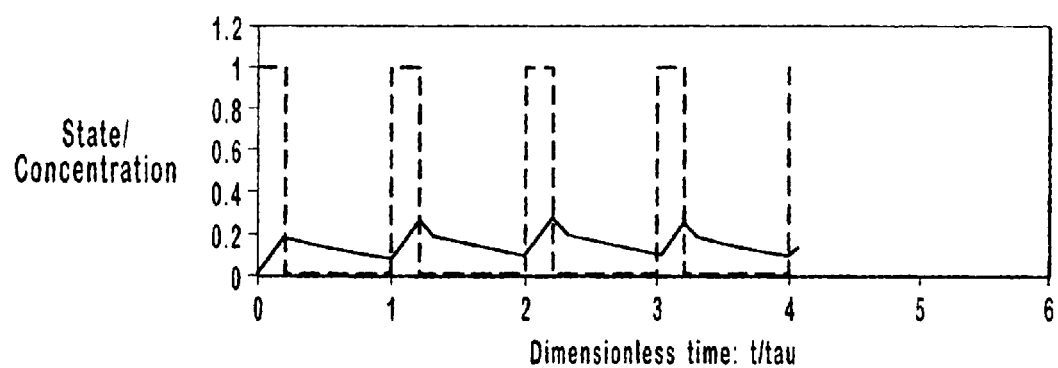
FIGS. 12A–12B are graphs illustrating a pulsing regime in which no steady state condition is reached for any of the states.
Figure 12B:
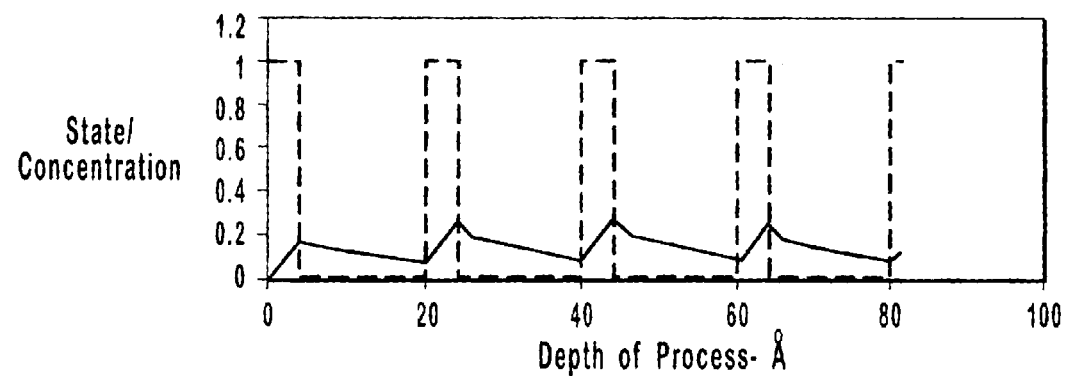
Figure 13A:
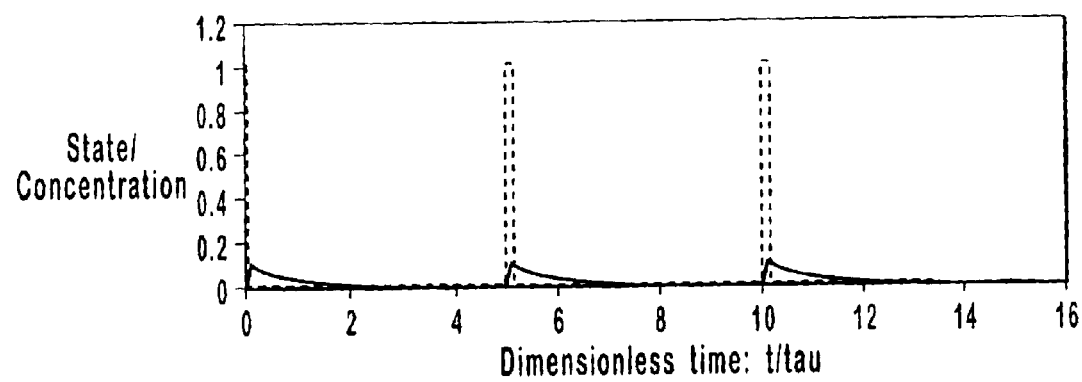
FIGS. 13A—13B are graphs illustrating a pulsing regime in which steady state conditions are reached for state 1.
Figure 13B:
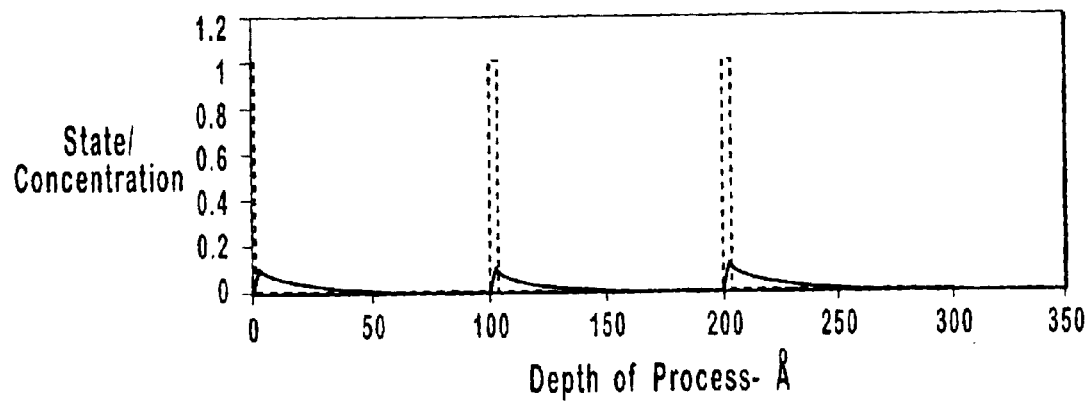
Figure 14A:
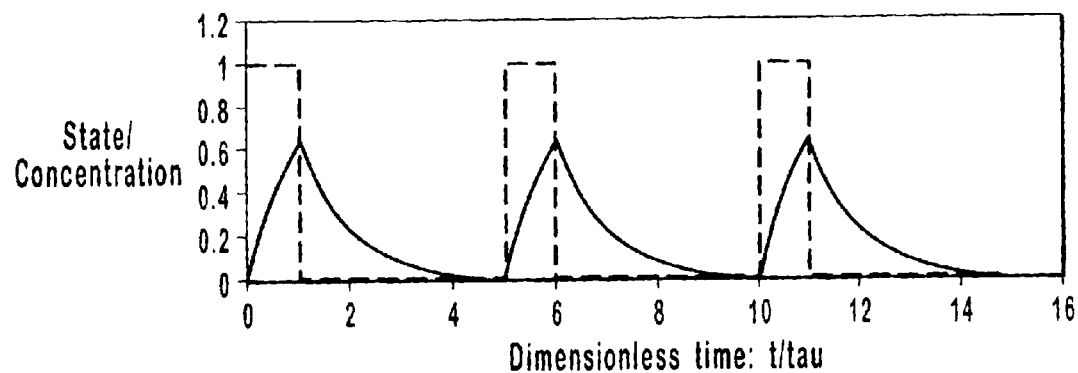
FIGS. 14A–14B are graphs illustrating a pulsing regime in which steady state conditions for state 1 are just reached and state 2 steady state conditions are attained to an extent of about 60%.
Figure 14B:
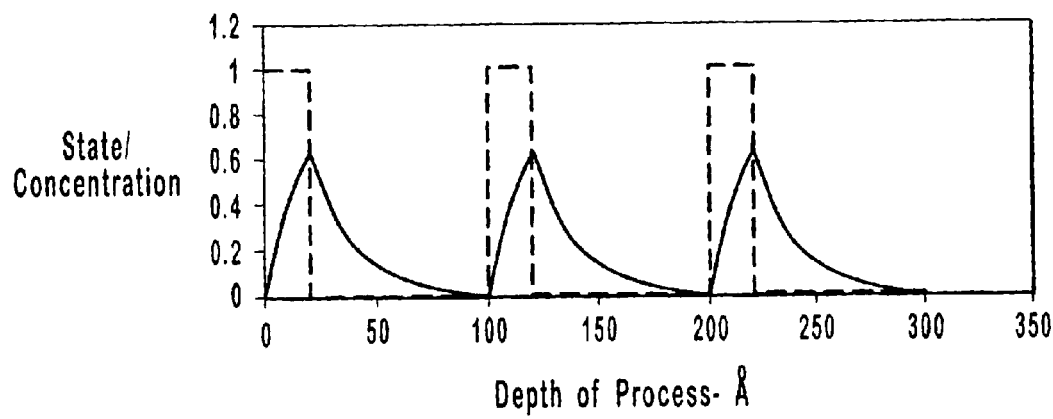

Pulsing according to the present invention is embodied under a wide variety of timing regimes. FIGS. 12A, B; 13A, B; and 14A, B provide additional examples of pulsing regimes. As indicated above, the ordinate axes in FIGS. 12A, B; 13A, B; and 14A, B provide readings concerning states and concentrations. The abscissae in FIGS. 12A, 13A and 14A provide readings concerning dimensionless time, and the abscissae in FIGS. 12B, 13B and 14B provide readings concerning depth of process (Å). Furthermore the ordinate reading of 0 indicates the low flow rate state 1 and the ordinate reading 1 indicates the high flow rate state 2.

The solid lines in FIGS. 12A, B; 13A, B; and 14A, B depict the evolution of actual concentrations, and the dashed lines depict state evolutions.

FIGS. 12A and 12B depict state/concentration as a function of dimensionless time and as a function of depth of process, respectively, under pulsing conditions that are characterized by τ being about 0.16 s, at 20% duty cycle, the period being approximately equal to τ, an on time of about 0.2τ, a state 1 etch depth of about 4.3 Å, a state 2 etch depth of about 17 Å, a total of about 21.3 Å etched per cycle, and an etch rate of about 133 Å/s. An etch depth of about 4.1 Å is comparable to a silicon dioxide monolayer thickness.

The solid lines in FIGS. 12A and 12B do not superimpose with the respective dashed lines. This feature indicates that under these pulsing conditions the medium within the chamber does not reach steady state conditions. As shown by the solid lines in FIGS. 12A and 12B, the transition time between state 1 and state 2 conditions is a significant fraction of the period, and the chamber operates under non steady state conditions for approximately all the time. FIGS. 12A and 12B illustrate an example of fast pulsing conditions in an embodiment of the present invention in which the system does not reach steady state conditions for any of the states 1 or 2.

FIGS. 13A and 13B depict state/concentration as a function of dimensionless time and as a function of depth of process, respectively, under pulsing conditions that are characterized by τ being about 0.1 6 s, the period being about 5τ, an on time of about 0.1τ, a state 1 etch depth of about 2.1 Å, a state 2 etch depth of about 104 Å, a total of about 106 Å etched per cycle, and an etch rate of about 133 Å/s.

The solid lines in FIGS. 13A and 13B do not superimpose with the respective dashed lines. As noted regarding the graphs shown in FIGS. 12A and 12B, this feature indicates that under these pulsing conditions the medium within the chamber does not reach steady state conditions. As shown by the solid lines in FIGS. 12A and 12B, the concentration is for a significant part of the time close to or approximately equal to the concentration that characterizes state 1. Under these pulsing conditions, the system reaches steady state conditions for state 1, but not for state 2. Like FIGS. 12A and 12B, FIGS. 13A and 13B illustrate an example of fast pulsing conditions in an embodiment of the present invention.

FIGS. 14A and 14B depict state/concentration as a function of dimensionless time and as a function of depth of process, respectively, under pulsing conditions that are characterized by τ being about 0.16 s, the period being about 5τ an on time of about 1τ, a state 1 etch depth of about 21 Å, a state 2 etch depth of about 85 Å, a total of about 106 Å etched per cycle, and an etch rate of about 133 Å/s.

The solid lines in FIGS. 14A and 14B do not superimpose with the respective dashed lines. As noted regarding the graphs shown in FIGS. 12A–13B, this feature indicates that under these pulsing conditions the medium within the chamber does not reach steady state conditions. As shown by the solid lines in FIGS. 14A and 14B, the concentration almost reaches state 2 steady state conditions with an on time of about τ. More specifically, the concentration reaches about 60% of its high flow, state 2, value. The same graphs also show that state 1 steady state conditions are just reached under these pulsing conditions, with state 2 conditions lasting for about 4τ in each pulsing cycle. FIGS. 14A and 14B illustrate an example of fast pulsing conditions in an embodiment of the present invention in which the system does not reach state 2 steady state conditions but just reaches state 1 steady state conditions. In this sense, pulsing conditions provided in this example are conditions between those referred to in the context of FIGS. 12A–12B and FIGS. 13A–13B.

As illustrated by the graphs shown in FIGS. 11A–14B, different actual concentrations of etchant and different etch depths occur in each part of the cycles of pulsed gas flows provided in the foregoing examples as the pulse times are varied. Furthermore, FIGS. 11A–14B illustrate the embodiments of the present invention that provide examples of a wide range of pulsing regimes, including very slow pulsing and very quick pulsing.

As any one with ordinary skill in the art will appreciate, process characteristics much as the number of gases introduced into the chamber, the number of protective layers formed in the process, the number of steps in the process, the number of steps and/or gases to which pulsing is applied as long as pulsing is applied in at least one step and/or to at least one gas flow, and whether pulsing is applied in the context of a process or a sequence of processes are not limitations to the present invention, because the present invention can be implemented with ordinary skill in the art under any combination of such parameters and conditions.

It is understood that although a number of wave profiles that illustrate pulsing conditions in the accompanying figures are square or quasi-square wave profiles, this particular wave-shape is not a limiting feature of the pulsing conditions in embodiments of the present invention. In contrast, pulsing according to the present invention is applied in different embodiments thereof with any suitable wave shape.

Except for example 1, the additional examples provided hereinbelow illustrate other embodiments of pulsing conditions according to the present invention.

Example 1

Figure 15:
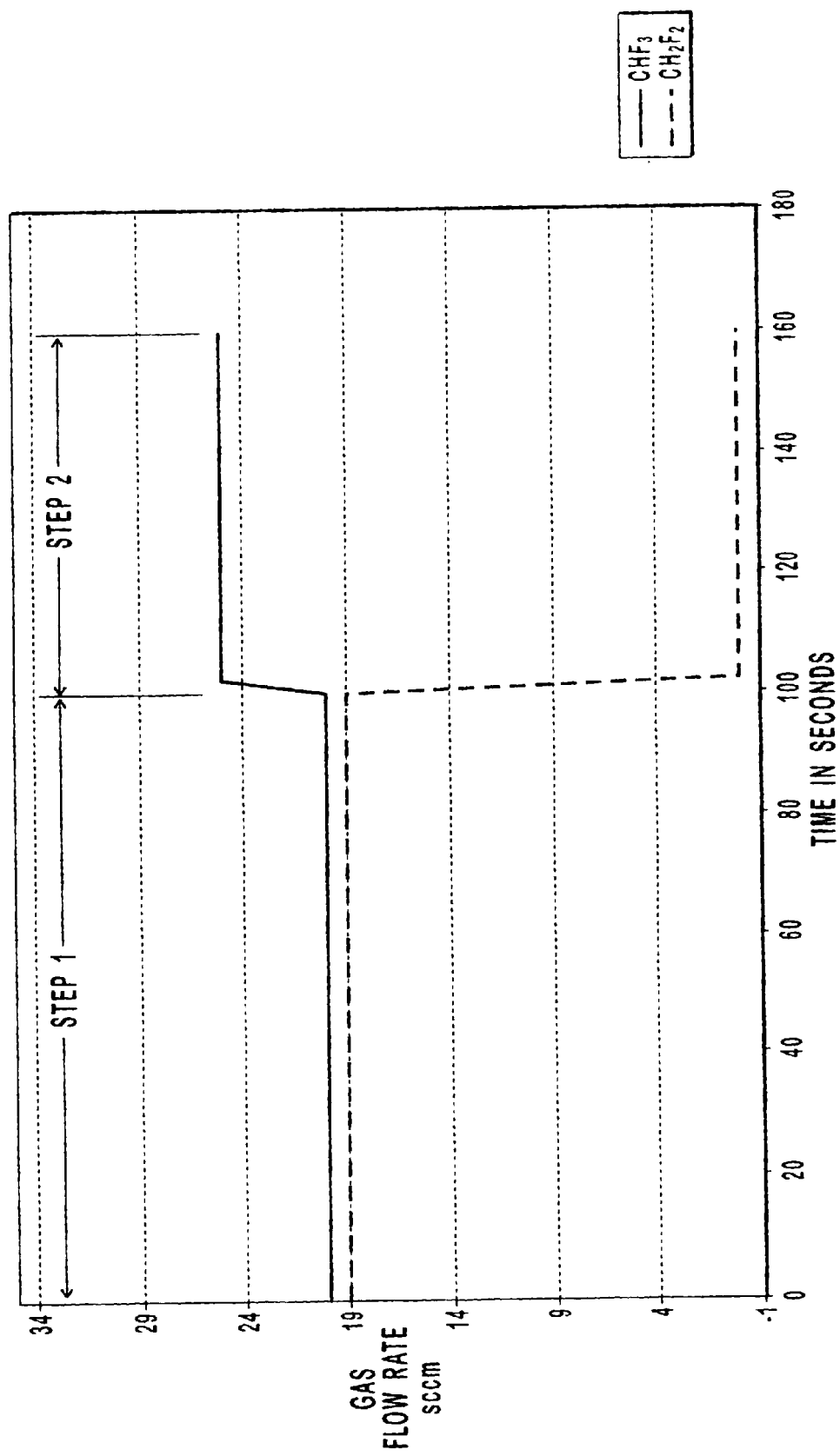
FIG. 15 is a graph illustrating a flow sequence in a two-stop non-pulsed process.

This example is provided for comparative purposes, so that the time varying gas flow rates in the following examples can be compared to the flow rate patterns of this example. This is a two-step process with no pulsing conditions in any step. As shown in FIG. 15, 19 sccm of $CHF_3$ and 20 sccm of $CH_2F_2$ are flowed at 20 mTorr for 100 s in step 1, and 25 sccm of $CHF_3$, but no $CH_2F_2$, is flowed at 30 mTorr for 60 s in step 2. These conditions are hereinafter represented according to the following notation convention:

Step 1: 1000 w Source/800 w Bias, 20 sccm $CHF_3$, 19 sccm $CH_2F_2$, 20 mTorr, 100 s.

Step 2: 1100 w Source/900 w Bias, 25 sccm $CHF_3$, 0 sccm $CH_2F_2$, 30 mTorr, 60 s.

Although the foregoing notation refers first to a higher flow rate value and subsequently to a lower flow rate value for each one of the steps, this order is not a limitation, but merely an example of the order in the implementation of some embodiments of the present invention. In other embodiments of the present invention, for example, flowing at a lower flow rate value precedes flowing at a higher flow rate value. The source and bias power are provided with reference to an embodiment such as that discussed in connection with FIG. 1.

Example 2

Figure 16:
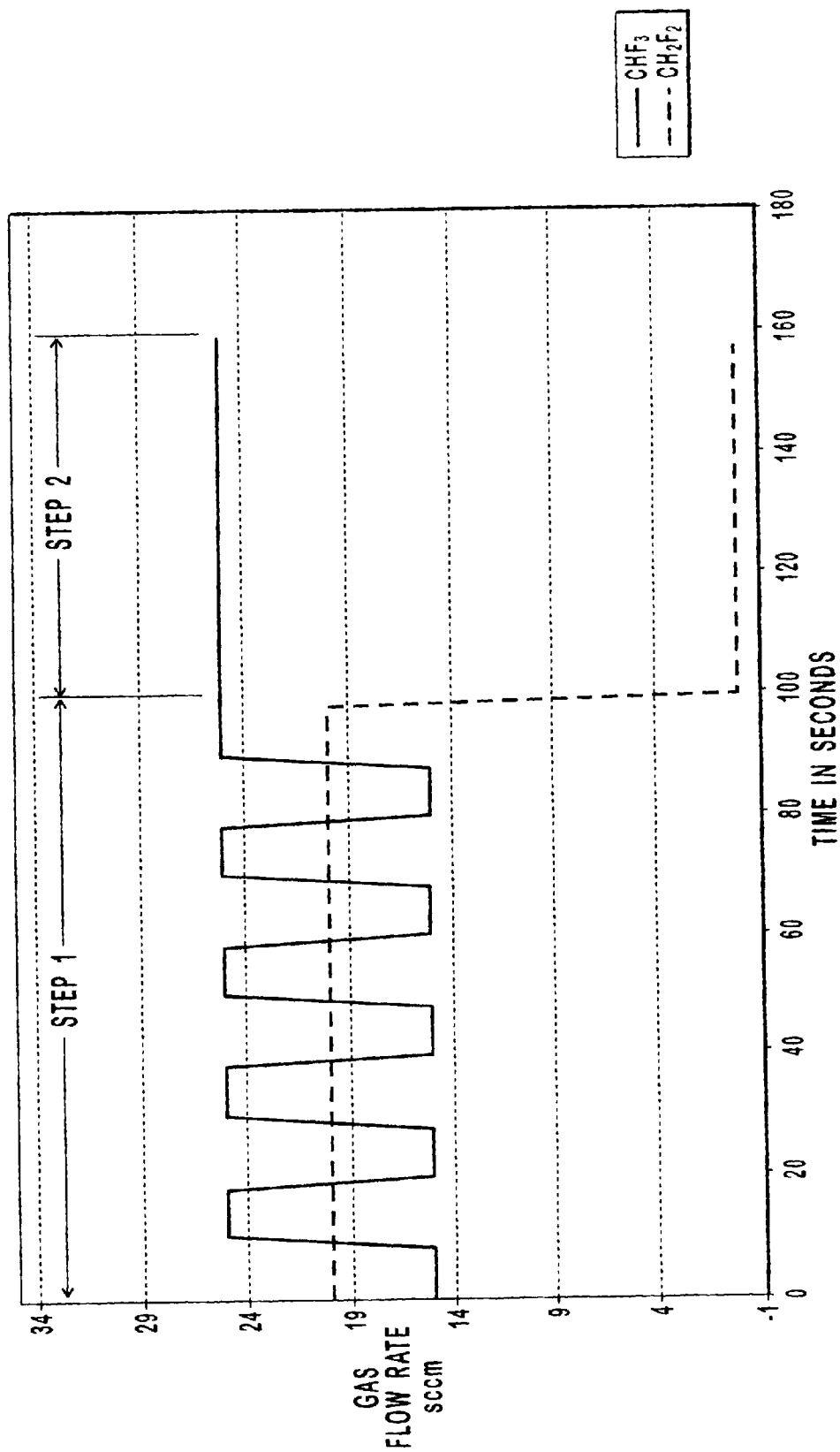
FIG. 16 is a graph illustrating a flow sequence in a multi-step process in which one gas is pulsed in one of the steps.

In this example, the series of steps 1 that are referred to alternatively as "1A" and "1B" run for a total of 100 s, with a duration of 10 s each. $CHF_3$ is pulsed in steps labelled "1A" and "1B", but $CH_2F_2$ is not pulsed. Only $CHF_3$ is flowed in step 2 under non-pulsing conditions. The gas flow rate conditions in this example are depicted graphically in FIG. 16 for steps 1 and 2, where the solid line displays the oscillating high and low flow regimes for $CHF_3$ in step 1. The conditions for this example are given numerically as follows:

Step 1A: 1000 w Source/800 w Bias, 15 sccm $CHF_3$, 20 sccm $CH_2F_2$, 20 mTorr, 10 sec.
Step 1B: 1000 w Source/800 w Bias, 25 sccm $CHF_3$, 20 sccm $CH_2F_2$, 20 mTorr, 10 sec.
Step 1A: 1000 w Source/800 w Bias, 15 sccm $CHF_3$, 20 sccm $CH_2F_2$, 20 mTorr, 10 sec.
Step 1B: 1000 w Source/800 w Bias, 25 sccm $CHF_3$, 20 sccm $CH_2F_2$, 20 mTorr, 10 sec.
Step 1A: 1000 w Source/800 w Bias, 15 sccm $CHF_3$, 20 sccm $CH_2F_2$, 20 mTorr, 10 sec.
Step 1B: 1000 w Source/800 w Bias, 25 sccm $CHF_3$, 20 sccm $CH_2F_2$, 20 mTorr, 10 sec.
Step 1A: 1000 w Source/800 w Bias, 15 sccm $CHF_3$, 20 sccm $CH_2F_2$, 20 mTorr, 10 sec.
Step 1B: 1000 w Source/800 w Bias, 25 sccm $CHF_3$, 20 sccm $CH_2F_2$, 20 mTorr, 10 sec.
Step 1A: 1000 w Source/800 w Bias, 15 sccm $CHF_3$, 20 sccm $CH_2F_2$, 20 mTorr, 10 sec.
Step 1B: 1000 w Source/800 w Bias, 25 sccm $CHF_3$, 20 sccm $CH_2F_2$, 20 mTorr, 10 sec.
Step 2: 1100 w Source/900 w Bias, 25 sccm $CHF_3$, 0 sccm $CH_2F_2$, 30 mTorr, 60 sec.

Example 3

Figure 17:
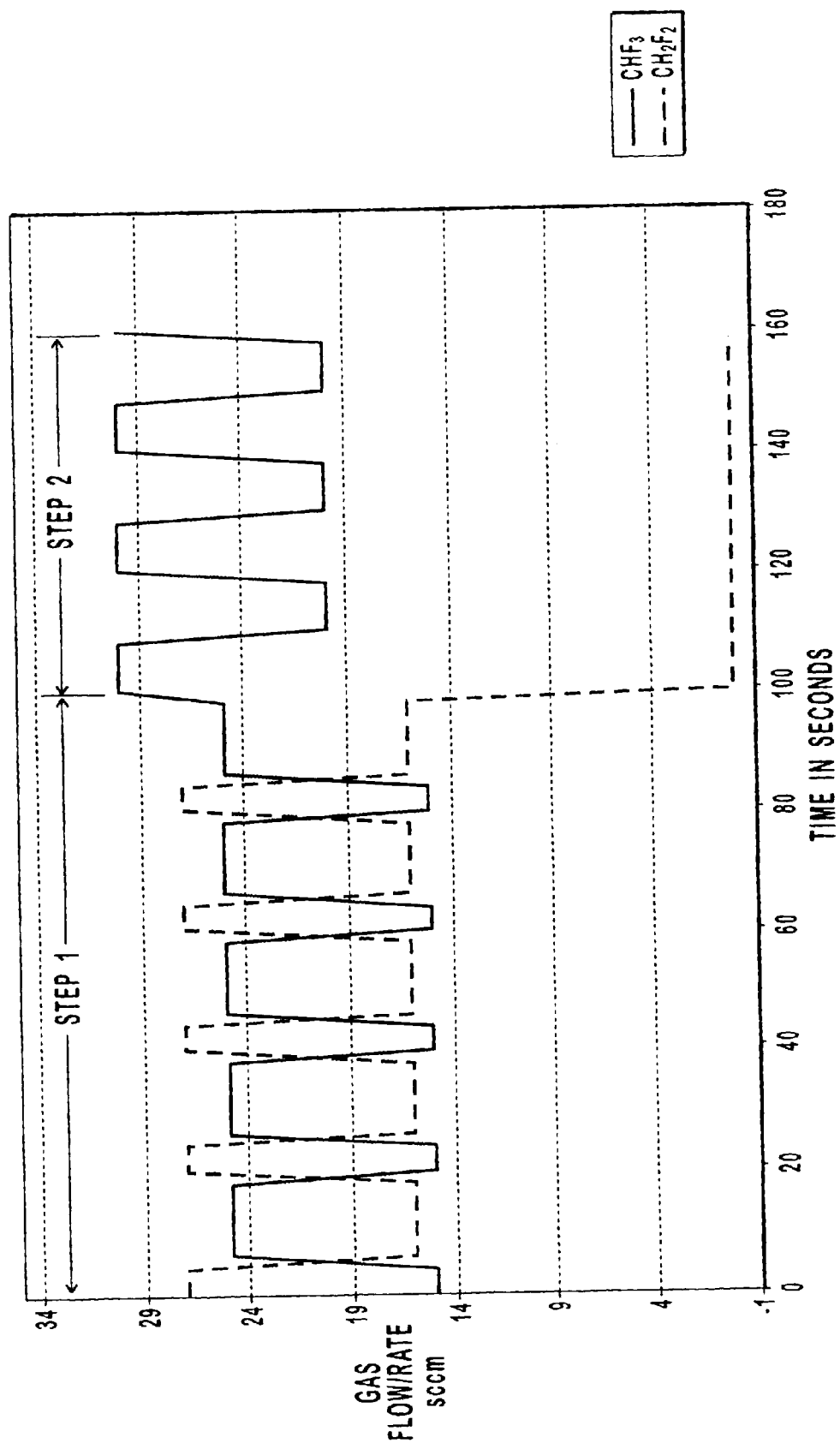
FIG. 17 is a graph illustrating a flow sequence in a multi-step process in which all gases are pulsed in both steps at the same period and duty cycle.

In this example, the series of steps 1 that are referred to alternatively as "1A" and "1B" are applied under pulsing conditions for both gases $CHF_3$ and $CH_2F_2$ as shown by the solid and dashed lines in FIG. 17 in the portion of the graph labelled "step 1". Only $CHF_3$ is provided under pulsing conditions but no $CH_2F_2$ is flowed in step 2, as shown by the solid and dashed lines in the portion of the graph labelled "step 2" in FIG. 17. The solid line in the same figure indicates that the high and low flow rates for $CHF_3$ under pulsing conditions in step 1 are different from the high and low flow rates for the same gas under pulsing conditions in step 2. Note also that all gases are pulsed in both steps in this example at the same period and duty cycle. The conditions for this example are given numerically as follows:

Step 1A: 1000 w Source/800 w Bias, 15 sccm $CHF_3$, 27 sccm $CH_2F_2$, 20 mTorr, 5 sec.
Step 1B: 1000 w Source/800 w Bias, 25 sccm $CHF_3$, 16 sccm $CH_2F_2$, 20 mTorr, 15 sec.
Step 1A: 1000 w Source/800 w Bias, 15 sccm $CHF_3$, 27 sccm $CH_2F_2$, 20 mTorr, 5 sec.
Step 1B: 1000 w Source/800 w Bias, 25 sccm $CHF_3$, 16 sccm $CH_2F_2$, 20 mTorr, 15 sec.
Step 1A: 1000 w Source/800 w Bias, 15 sccm $CHF_3$, 27 sccm $CH_2F_2$, 20 mTorr, 5 sec.
Step 1B: 1000 w Source/800 w Bias, 25 sccm $CHF_3$, 16 sccm $CH_2F_2$, 20 mTorr, 15 sec.
Step 1A: 1000 w Source/800 w Bias, 15 sccm $CHF_3$, 27 sccm $CH_2F_2$, 20 mTorr, 5 sec.
Step 1B: 1000 w Source/800 w Bias, 25 sccm $CHF_{3,\ 16}$ sccm $CH_2F_2$, 20 mTorr, 15 sec.
Step 1A: 1000 w Source/800 w Bias, 15 sccm $CHF_3$, 27 sccm $CH_2F_2$, 20 mTorr, 5 sec.
Step 1B: 1000 w Source/800 w Bias, 25 sccm $CHF_3$, 16 sccm $CH_2F_2$, 20 mTorr, 15 sec.
Step 2A: 1100 w Source/900 w Bias, 30 sccm $CHF_3$, 0 sccm $CH_2F_2$, 30 Torr, 15 sec.
Step 2B: 1100 w Source/900 w Bias, 20 sccm $CHF_3$, 0 sccm $CH_2F_2$, 30 mTorr, 15 sec.
Step 2A: 1100 w Source/900 w Bias, 30 sccm $CHF_3$, 0 sccm $CH_2F_2$, 30 mTorr, 15 sec.
Step 2B: 1100 w Source/900 w Bias, 20 sccm $CHF_3$, 0 sccm $CH_2F_2$, 30 mTorr, 15 sec.

Example 4

This embodiment provides an example of a flow sequence in which two gases, gas 1 and gas 2, are pulsed with different periods or duty cycles. The timing chart for this example shown in FIGS. depicts the flow rates that are controlled with external signal generators that drive the set points to the mass flow controllers.

Example 5

In this embodiment, at least one gas is flowed under pulsing conditions, and after evacuation at least a second gas is flowed under pulsing conditions.

Example 6

In this embodiment, at least one gas is flowed under pulsing conditions to form part of an etch and subsequently pulsing is applied under different conditions to form another part of the etch.

Example 7

In this embodiment, at least one gas is flowed under pulsing conditions to provide a plurality of protective layers.

Example 8

In this embodiment, at least one gas is flowed under pulsing conditions to control the etch profile of an oxide film. In some implementations of this embodiment, this control comprises controlling the deposition of a side wall film.

Example 9

In this embodiment, at least one gas is flowed under pulsing conditions to control the etch profile of a multi-layer resist.

Example 10

In this embodiment, at least one gas is flowed under pulsing conditions to control the etch profile of a metal.

Example 11

In this embodiment, at least one gas is flowed under pulsing conditions to control the etch profile of an alloy, such as an aluminum alloy.

Example 12

In this embodiment, at least one gas is flowed under pulsing conditions to control the etch profile of tungsten.

Example 13

In this embodiment, at least one gas is flowed under pulsing conditions to control the etch profile of a conductor.

Example 14

In this embodiment, at least one gas is flowed under pulsing conditions to control the etch profile of polysilicon.

Example 15

In this embodiment, at least one gas is flowed under pulsing conditions to control the etch profile of a polysilicide.

Example 16

In this embodiment, at least one gas is flowed under pulsing conditions to control etch profile and achieve deposition, including side wall deposition, with a high density etcher.

Example 17

In this embodiment, at least one gas such as $O_2$ or a gas mixture that includes $O_2$ is flowed under pulsing conditions to change deposition on a substrate.

Example 18

In this embodiment, at least one gas such as CO or a gas mixture that includes CO is flowed under pulsing conditions to change deposition on a substrate.

Example 19

In this embodiment, at least one gas such as $CO_2$ or a gas mixture that includes $CO_2$ is flowed under pulsing conditions to change deposition on a substrate.

Example 20

In this embodiment, pulsing conditions are applied to a hydrofluorocarbon gas in an oxide etching process.

Example 21

In this embodiment, pulsing is applied as described in Example 20 and further pulsing is applied to any additional gas that affects deposition.

Example 22

In this embodiment, aluminum etching is achieved with pulsing conditions applied to at least the flow of $BCl_3$.

Example 23

In this embodiment, aluminum etching is achieved with pulsing conditions applied to at least the flow of $Cl_2$.

Example 24

In this embodiment, pulsing is applied as described in Example 16, under pulsing conditions that apply about 20% to about 80% duty cycle.

Example 25

In this embodiment, pulsing is applied as described in Example 16, under pulsing conditions that apply about 30% to about 70% duty cycle.

Example 26

In this embodiment, pulsing is applied as described in Example 16, under pulsing conditions that apply about 40% to about 60% duty cycle.

Example 27

In this embodiment, pulsing is applied as described in Example 16, under pulsing conditions that apply about 50% duty cycle.

Example 28

In this embodiment, pulsing is applied as described in Example 16, under pulsing conditions characterized by a period within the range from about $5\tau$ to about $25\tau$.

Example 29

In this embodiment, pulsing is applied as described in Example 16, under pulsing conditions characterized by a period within the range from about $10\tau$ to about $20\tau$.

Example 30

In this embodiment, pulsing is applied as described in Example 16, under pulsing conditions characterized by a period of about $15\tau$.

Example 31

In this embodiment, pulsing conditions are applied to a fluorocarbon gas in an oxide etching process.

Example Set 32

This example set refers collectively to a number of embodiments of sequences comprising each at least one of the embodiments described hereinabove which is repeatedly applied as part of a sequence.

While the particular process as herein shown and disclosed in detail is fully capable of obtaining the objects and advantages herein before stated, it is to be understood that it is merely illustrative of the presently preferred embodiments of the inventions and that no limitations are intended to the details of construction or design herein shown other than as described in the appended claims.

One having ordinary skill in the art will realize that even though a memory device was used as an illustrative example, the process is equally applicable to other semiconductor devices and integrated circuits.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by united states letters patent is:

1. A method to control etch profile while etching a microelectronics substrate, the method comprising:

providing an etch chamber and a microelectronics substrate disposed therein; and pulsing into said etch chamber at least one gas wherein said pulsing imparts a time varying flow rate to said gas for a plurality of periods of said time varying flow rate;

wherein the pulsing provides for the alternating steps of:

etching said microelectronics substrate with said at least one gas; and forming a deposit with said at least one gas on a side surface of the microelectronics substrate, the deposit preventing additional etching of the side surface of said microelelectronics substrate underneath the deposit;

wherein said pulsing is applied so that said at least one gas does not reach steady state concentration within said etch chamber in said plurality of periods.

2. The method as defined in claim 1, wherein said etch chamber is associated with a high density etch tool.

3. The method as defined in claim 1, wherein said substrate is selected from the group consisting of an oxide film, a resist, a multi-layer resist, a metal, a metal alloy, an aluminum alloy, a refractory metal, tungsten, an electrical conductor, and at least one polysilicide.

4. The method as defined in claim 1, wherein said pulsing is applied so that said at least one gas reaches steady state concentration within said etch chamber in at least one of said plurality of periods.

5. The method as defined in claim 1, wherein said pulsing is applied at a duty cycle range selected from the group consisting of:
   from about 20% to about 80% duty cycle;
   from about 30% to about 70% duty cycle; and
   from about 40% to about 60% duty cycle.

6. The method as defined in claim 1, wherein said at least one gas comprises a gas selected from the group consisting of $CHF_3$, $CH_2F_2$, a halogenated hydrocarbon, a hydrofluorocarbon, $CO$, $CO_2$, $O_2$, $Ar$, a fluorocarbon, $CF_4$, $C_4F_8$, $C_5F_8$, $BCl_3$, $Cl_2$.

7. The method as defined in claim 1, further comprising flowing a second gas comprising at least one of the gases nitrogen, oxygen and an inert gas into said etch chamber.

8. The method as defined in claim 1, wherein said pulsing is controlled with at least one piezoelectric valve.

9. The method as defined in claim 1, wherein said etching is a process selected from the group consisting of:
   an anisotropic self-aligned contact etch; and
   an anisotropic high aspect ratio contact etch, wherein the aspect ratio is at least 4 to 1.

10. The method as defined in claim 1, further comprising flowing nitrogen gas into said etch chamber.

11. The method as defined in claim 1, wherein said time varying flow rate varying within a range selected from the group consisting of:
   between a high flow rate value of about 30 sccm to a low flow rate value of about 15 sccm;
   between a high flow rate value of about 27 sccm to a low flow rate value of about 18 sccm;
   between a high flow rate value of about 25 sccm to a low flow rate value of about 20 sccm;
   between a low flow rate value of about 20 sccm to a high flow rate value of about 30 sccm; and
   between a low flow rate value of about 15 sccm to a high flow rate value of about 20 sccm.

12. The method as defined in claim 11, wherein each of the high and low flow rate values has about the same time duration.

13. The method as defined in claim 1, further comprising flowing an etchant gas into said etch chamber.

14. The method as defined in claim 13, wherein said etchant gas is selected from the group consisting of a polymer forming gas, an etching gas, and a fluorocarbon.

15. The method as defined in claim 1, wherein:
   said gas is a protective layer forming gas, wherein the protective layer comprises a polymer;
   said microelectronics substrate has at least an oxide layer; and
   said gas selectively removes at least a portion of said oxide layer and a vertical profile in said oxide layer.

16. The method as defined in claim 15, wherein said oxide layer comprises BPSG.

17. The method as defined in claim 1, wherein said layered substrate comprises a thermal oxide layer disposed on a silicon layer.

18. The method as defined in claim 17, wherein said etching halts on said thermal oxide layer disposed on said silicon layer.

19. The method as defined in claim 1, further comprising, prior to providing said etch chamber, patterning a layered substrate with a photoresist mask to form said microelectronics substrate.

20. The method as defined in claim 19, wherein said layered substrate comprises an oxide layer and a nitride layer disposed on a silicon layer.

21. The method as defined in claim 20, wherein said etching halts on said silicon layer.

22. The method as defined in claim 19, wherein said layered substrate comprises at least an oxide layer; the method further comprising flowing an etchant gas into said etch chamber, wherein said etchant gas selectively removes at least a portion of said oxide layer.

23. A method of etching oxide using a polymer, the method comprising:
   disposing a patterned semiconductor substrate in a high density plasma etcher, said substrate comprising a silicon layer with a gate stack structure disposed thereon, said gate stack structure being encapsulated by silicon nitride, and layered with an oxide;
   providing a hydrofluorocarbon gas into said high density etcher;
   selectively removing portions of said oxide by pulsing a fluorocarbon gas; wherein:
      said pulsing imparts a time varying flow rate to said fluorocarbon gas for a plurality of periods of said time varying flow rate, wherein said hydrofluorocarbon gas is pulsed in a range from about 0 sccm to about 25 sccm and is at least intermittently at a higher concentration than said fluorocarbon gas;
      said hydrofluorocarbon gas removes portions of said oxide; and
      said fluorocarbon gas forms a protective layer; and
   wherein the pulsing of said fluorocarbon gas causes said hydrofluorocarbon gas to have cyclical concentrations within said high density etcher.

24. The method as defined in claim 23, wherein said hydrofluorocarbon gas is pulsed into said high density etcher so that the hydrofluorocarbon gas pulses alternate with the fluorocarbon gas pulses and wherein pulsing said hydrofluorocarbon gas imparts a time varying flow rate to said hydrofluorocarbon gas for a plurality of periods of said time varying flow rate.

25. The method as defined in claim 24, wherein said hydrofluorocarbon gas is pulsed into said high density etcher with at least one piezoelectric valve.

26. A etching method comprising:
   forming a photoresist pattern on a microelectronics substrate that includes both an oxide layer and a nitride layer disposed on a silicon layer;
   providing an etch chamber and said microelectronics substrate disposed therein;
   pulsing into said etch chamber at least one gas suitable for forming a deposit on at least a portion of said microelectronics substrate, wherein:
      said deposit is selected from the group consisting of an oxide film, a resist, a multi-layer resist, a metal, a metal alloy, an aluminum alloy, a refractory metal, tungsten, an electrical conductor, polysilicon, and at least one polysilicide;
      said at least one gas comprises a gas selected from the group consisting of a halogenated hydrocarbon, and a fluorocarbon;

said pulsing imparts a time varying flow rate to said gas for a plurality of periods of said time varying flow rate;

said pulsing is applied at a duty cycle range selected from the group consisting of:
from about 20% to about 80% duty cycle;
from about 30% to about 70% duty cycle; and
from about 40% to about 60% duty cycle;

said time varying flow rate varies within a range selected from the group consisting of:
between a high flow rate value of about 30 sccm to a low flow rate value of about 15 sccm;
between a high flow rate value of about 27 sccm to a low flow rate value of about 18 sccm;
between a high flow rate value of about 25 sccm to a low flow rate value of about 20 sccm;
between a high flow rate value of about 20 sccm to a low flow rate value of about 30 sccm; and
between a high flow rate value of about 15 sccm to a low flow rate value of about 20 sccm;

etching said microelelectronics substrate with said a second gas during said pulsing, wherein:
wherein said second gas is at least intermittently at a higher concentration than said first gas;
said etching halts on said silicon layer;
said second gas is selected from the group consisting of a polymer forming gas, a polymer etching gas, and a fluorocarbon; and
said second gas selectively removes at least a portion of said oxide layer.

27. The method as defined in claim 26, wherein said pulsing is applied so that said at least one gas reaches steady state concentration within said etch chamber in at least one of said plurality of periods.

28. The method as defined in claim 26, wherein said pulsing is applied so that said at least one gas does not reach steady state concentration within said etch chamber in said plurality of periods.

29. The method as defined in claim 26, further comprising flowing a gas comprising at least one of the gases nitrogen, oxygen and an inert gas into said etch chamber.

30. An etching method comprising:
exposing a substrate to a plurality of gases, wherein at least one of said gases is pulsed and said pulsing imparts a time varying flow rate to said at least one gas for a plurality of periods of said time varying flow rate; and wherein
at least one of said gases comprises an etchant gas selected from the group consisting of a hydrofluorocarbon and a fluorocarbon; and
at least one of said gases comprises a polymer forming gas for depositing a protective layer, wherein said etchant gas is at least intermittently at a higher concentration than said polymer forming gas.

31. The method as defined in claim 30, wherein said gas for depositing a protective layer comprises one gas for depositing a polymer.

32. The method as defined in claim 30, wherein said etchant gas comprises one gas selected from the group consisting of a hydrofluorocarbon and a fluorocarbon.

33. The method as defined in claim 30, wherein
at least one of said gases comprises a gas that modifies the deposition of said protective layer; and
at least one of said gases comprises an etch modifying gas.

34. The method as defined in claim 33, wherein said gas that modifies the deposition of a protective layer is selected from the group consisting of CO, $CO_2$, and $O_2$.

35. The method as defined in claim 33, wherein said etch modifying gas is selected from the group consisting of $BCl_3$ and $Cl_2$.

36. A method to control etch profile while etching a microelectronics substrate, the method comprising:
providing an etch chamber and a microelectronics substrate disposed therein;
pulsing into said etch chamber a carbon containing polymer gas suitable for;
forming a deposit on at least a portion of said microelectronics substrate; and
etching said microelelectronics substrate;
wherein said pulsing imparts a time varying flow rate to said gas for a plurality of periods of said time varying flow rate, thereby causing said gas to alternately form a deposit on at least a portion of said microelectronics substrate and etch said microelelectronics substrate and wherein said pulsing is applied so that said carbon containing polymer gas does not reach steady state concentration within said etch chamber in said plurality of periods.

37. The method as defined in claim 36, wherein said microelectronics structure includes a nitride layer.

38. The method as defined in claim 37, wherein said nitride layer is at least one of a silicon nitride layer and a silicon oxynitride layer.

39. A method to provide increased gas flow rate tolerances while etching a microelectronics substrate, the method comprising:
providing an etch chamber and a microelectronics substrate disposed therein;
providing at least one gas for introduction into the etch chamber, the at least one gas capable of both etching the microelelectronics substrate and forming a deposit on a side surface of the microelectronics substrate, wherein use of the at least one gas at a uniform flow rate provides a desired etch profile in the microelectronics substrate at a flow rate selected within a first process window; and
pulsing into the etch chamber the at least one gas wherein the pulsing imparts a time varying flow rate to the gas for a plurality of periods of the time varying flow rate, wherein the pulsing provides for the alternating steps of:
etching the microelelectronics substrate with the at least one gas; and
forming a deposit with the at least one gas on a side surface of the microelectronics substrate, the deposit preventing additional etching of the side surface of the microelelectronics substrate underneath the deposit;
wherein the pulsing enables the selection of flow rates from within a second process window that is larger than the first process window while still providing the desired etch profile in the microelectronics substrate.

40. The method as defined in claim 39, wherein the pulsing is applied so that the at least one gas does not reach steady state concentration within the etch chamber in the plurality of periods.

* * * * *

UNITED STATES PATENT AND TRADEMARK OFFICE
CERTIFICATE OF CORRECTION

PATENT NO. : 6,784,108 B1
DATED : August 31, 2004
INVENTOR(S) : Kevin G. Donohoe and David S. Becker It is certified that error appears in the above-identified patent and that said Letters Patent is hereby corrected as shown below:

Drawings,
Change lower circuit structure label "36" to -- 38 --

Column 5,
Line 49, after "of the present invention" insert -- . --

Column 8,
Line 8, before "fluorocarbons" remove "is"
Line 21, change "hydrofluorcarbon gas CHF" to -- hydrofluorocarbon gas $CHF_3$ --

Column 9,
Line 51, before "up along" change "build" to -- built --

Column 12,
Line 20, change "CW(O)" to -- CW(0) --
Line 32, before "was about 0.25 s" insert -- $\tau$ --
Line 67, before "1 indicates" insert -- of --

Column 13,
Line 29, after "$\tau$ being about" change "0.1 6 s" to -- 0.16 s --
Line 48, after "$5\tau$" insert -- , --

Column 14,
Line 13, after "characteristics" change "much" to -- such --

Column 15,
Line 60, after "$CHF_3$," change "$_{16}$" to -- 16 --

Figure 18:
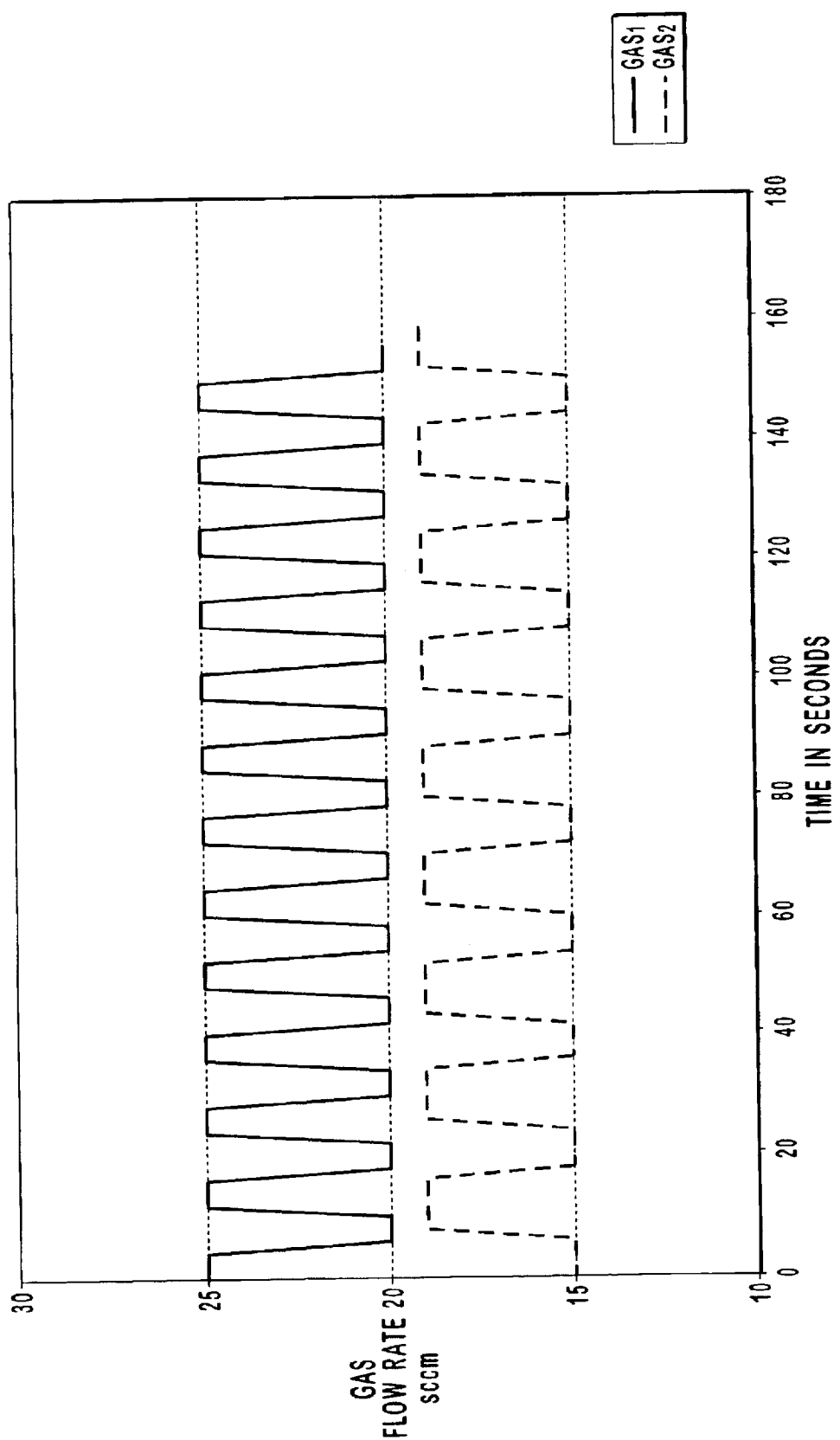
FIG. 18 is a graph illustrating a timing chart for the gas flow rates of two gases with different periods or duty cycles.

Column 16,
Line 13, change "FIGS." to -- FIG. 18 --

UNITED STATES PATENT AND TRADEMARK OFFICE
CERTIFICATE OF CORRECTION

PATENT NO. : 6,784,108 B1
DATED : August 31, 2004
INVENTOR(S) : Kevin G. Donohoe and David S. Becker It is certified that error appears in the above-identified patent and that said Letters Patent is hereby corrected as shown below:

Column 22,
Line 13, change "for;" to -- for: --

Signed and Sealed this

Eighth Day of February, 2005

JON W. DUDAS
*Director of the United States Patent and Trademark Office*